(12) United States Patent
Ogihara et al.

(10) Patent No.: US 8,022,387 B2
(45) Date of Patent: Sep. 20, 2011

(54) COMPOSITE SEMICONDUCTOR DEVICE HAVING A THYRISTOR STRUCTURE

(75) Inventors: Mitsuhiko Ogihara, Hachioji (JP); Hiroyuki Fujiwara, Hachioji (JP); Masataka Muto, Hachioji (JP); Takahito Suzuki, Hachioji (JP); Tomoki Igari, Hachioji (JP)

(73) Assignee: Oki Data Corporation, Tokyo (JP)

( * ) Notice: Subject to any disclaimer, the term of this patent is extended or adjusted under 35 U.S.C. 154(b) by 246 days.

(21) Appl. No.: 11/535,132

(22) Filed: Sep. 26, 2006

(65) Prior Publication Data
US 2007/0075330 A1    Apr. 5, 2007

(30) Foreign Application Priority Data

Sep. 30, 2005   (JP) .................................. 2005-285887

(51) Int. Cl.
*H01L 29/06*   (2006.01)
*H01L 31/00*   (2006.01)

(52) U.S. Cl. ............................... 257/13; 257/79; 438/22
(58) Field of Classification Search .................... 257/13, 257/79; 438/22
See application file for complete search history.

(56) References Cited

U.S. PATENT DOCUMENTS

| 5,851,905 A | 12/1998 | McIntosh et al. |
| 6,358,631 B1 | 3/2002 | Forrest et al. |
| 6,825,500 B1 * | 11/2004 | Komaba .......................... 257/96 |
| 2002/0093020 A1 * | 7/2002 | Edmond et al. ................. 257/79 |

FOREIGN PATENT DOCUMENTS

JP    2004-179646 A    6/2004

OTHER PUBLICATIONS

EP Search Report Issued Mar. 30, 2011 in EP Application No. 06121248.6.

* cited by examiner

*Primary Examiner* — Jami M Valentine
(74) *Attorney, Agent, or Firm* — Panitch Schwarze Belisario & Nadel LLP

(57) ABSTRACT

A semiconductor device includes a light-emitting layer of a first conductivity type, a second conductivity type or non-doped type, a first contact layer of the second conductivity type disposed on the light-emitting layer and supplied with a voltage via a predetermined contact, a second contact layer of the second conductivity type disposed below the light-emitting layer and supplied with a voltage via a predetermined contact, a first etching stopper layer of the first or second conductivity type disposed below the light-emitting layer and above the second contact layer, and a third contact layer of the first conductivity type disposed below the second contact layer and supplied with a voltage via a predetermined contact.

20 Claims, 34 Drawing Sheets

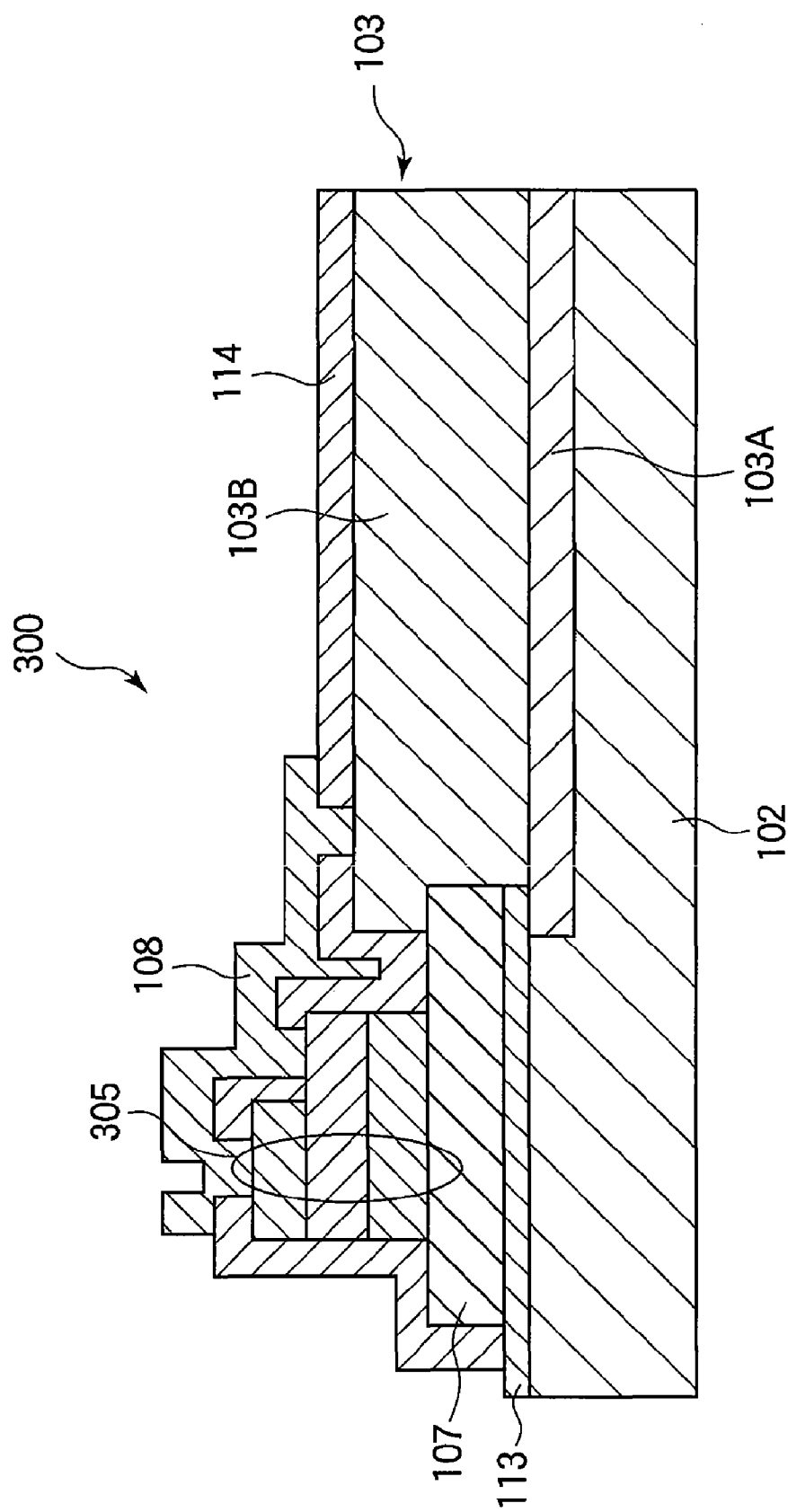

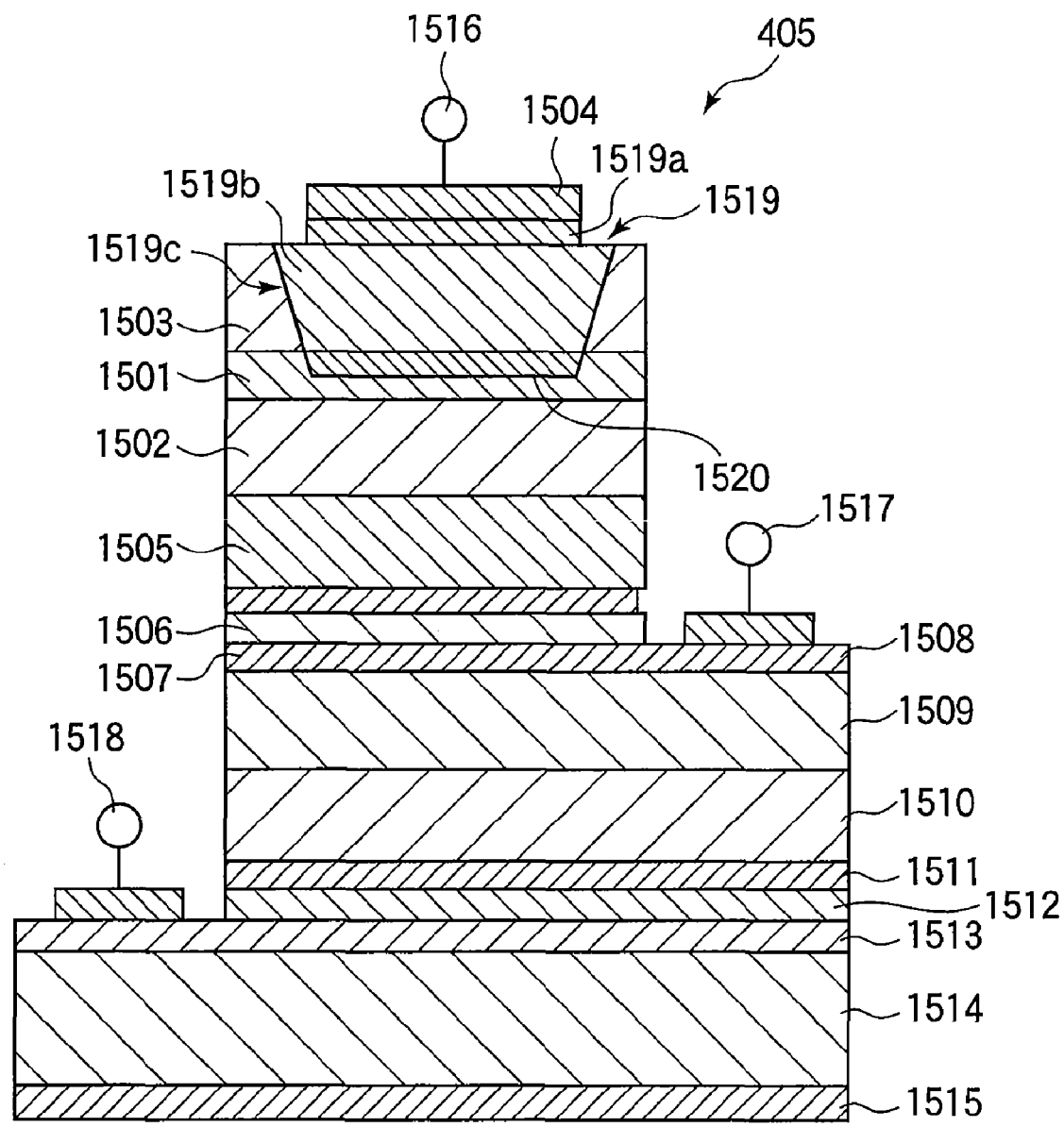

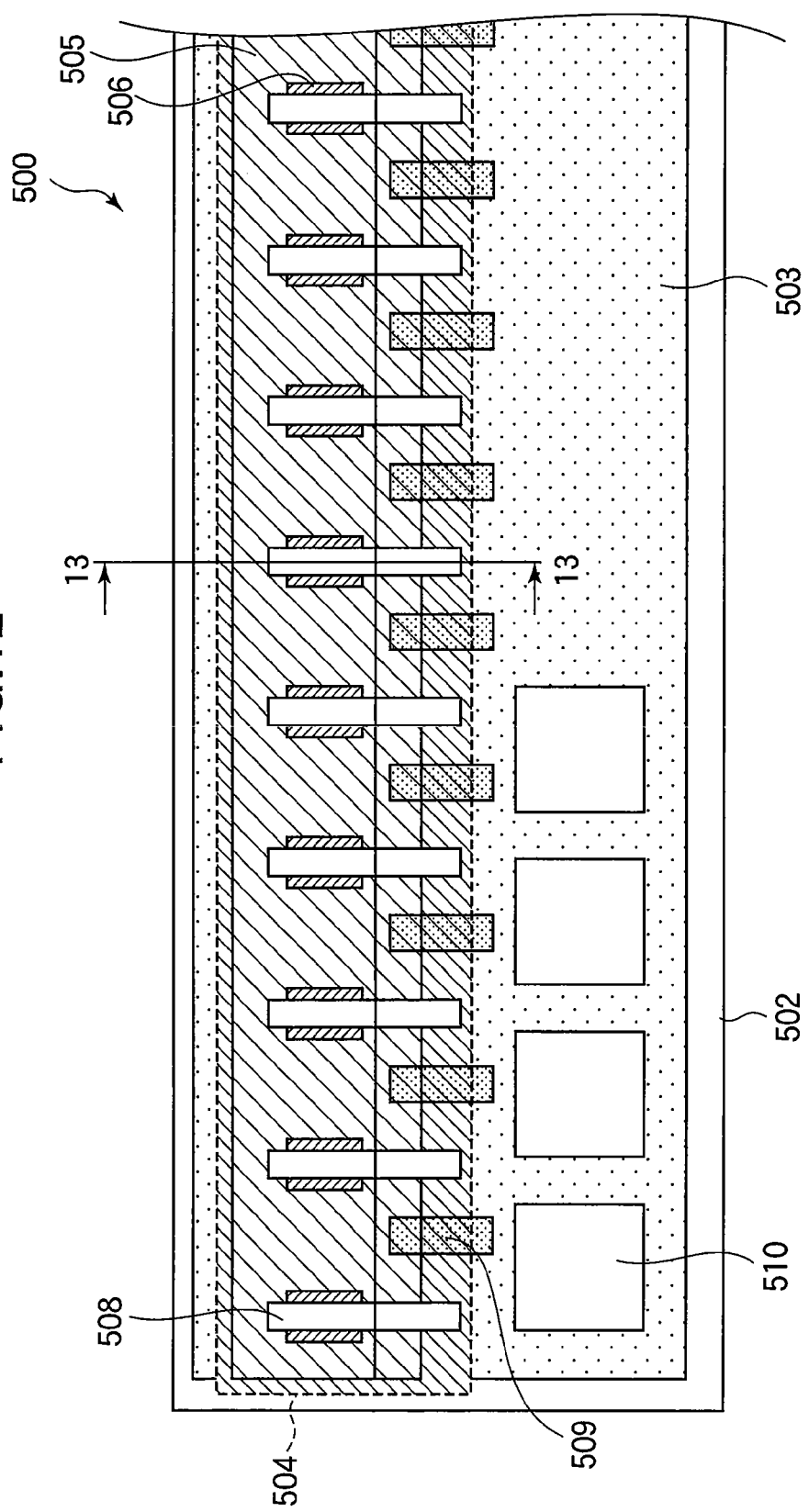

COMPOSITE SEMICONDUCTOR DEVICE HAVING A THYRISTOR STRUCTURE

BACKGROUND OF THE INVENTION

The present invention relates to a composite semiconductor device used in a print head used of an image forming apparatus such as an electrophotographic printer.

Conventional optical print heads are disclosed in, for example, Japanese Laid-Open Patent Publication No. 2004-179646 or "Design of Optical Printer" published by Triceps under the editorship of Yoshihiro Takekida.

The former document (i.e., Japanese Laid-Open Patent Publication No. 2004-179646) discloses a thin-film light-emitting element. The light-emitting element is connected to an integrated circuit (including driving circuits) via a thin-film wiring layer using a printed wiring technique.

With such an arrangement, it becomes possible to obtain an LED (Light Emitting Diode) which includes small number of expensive compound semiconductor materials, and to enhance the yield rate and the tolerance to mechanical stress (by virtue of printed wiring technique).

FIGS. 34 and 35 are respectively a perspective view and a plan view showing the conventional LED unit 1. As shown in FIG. 34, the LED unit 1 includes a unit substrate 2 (such as a glass substrate or a ceramic substrate), LED chips 3 including a plurality of light-emitting portion 6 arranged on the unit substrate 2, driver IC chips 4 for controlling the light-emitting portions 6, and bonding wires 5 including metal wires electrically connecting the LED chips 3 and the driver IC chips 4. The LED chips 3 and the driver IC chips 4 have the thickness of approximately 30 μm, and are bonded onto the unit substrate 2 by means of die-bonding.

As shown in FIG. 35, each LED chip 3 includes the light-emitting portions 6 that emit lights and individual electrodes 7 for supplying power to the light emitting portions 6. Each individual electrode 7 has the size of, for example, 100 μm×100 μm, in order to provide a sufficient region for wire-bonding using Au wire. The pn-junction that forms a light-emitting region is at a distance from 3 μm to 5 μm from the surface of the unit substrate 2.

However, the conventional print head using the above described LED unit 1 has problems as described below.

For reliable wire-bonding between the LED chip 3 and the driver IC chip 4, it is necessary to provide wire-bonding pads on each LED chip 3 and the driver IC chip 4. The wire-bonding pads occupy large regions on the LED chip 3, and therefore the light-emitting region on the LED chip 3 decreases. Since the rate of the light-emitting region to the surface area of the LED chip 3 decreases, the structure of the LED chip 3 is inefficient in terms of efficiency in use of semiconductor materials. In other words, since it is necessary to provide regions for wire-bonding pads on the LED chip 3, it is difficult to miniaturize the LED chip 3 to thereby reduce material cost.

Further, the light-emitting region formed is at a distance of approximately from 3 μm to 5 μm from the surface of each LED chip 3, whereas the thickness of the LED chip 3 is approximately 300 μm. Therefore, it is difficult to efficiently use the materials of the LED chip 3 in the direction of the thickness thereof. Moreover, GaAs substrate (i.e., the base material of the LED chip 3) only functions as a supporting body that supports GaAsP epitaxial layer having a light-emitting function. Furthermore, in order to prevent the short-circuit between the bonding wires and the LED chip 3 during the wire-bonding operation, the thicknesses of the LED chip 3 and the driver IC chip 4 need to be almost the same. Therefore, it is difficult to reduce the thickness of the GaAs substrate and to thereby reduce the material cost, while ensuring the function as a supporting body and the region for wire-bonding.

SUMMARY OF THE INVENTION

The present invention is intended to solve the above described problems, and an object of the present invention is to efficiently provide a light-emitting region on each chip, to thereby reduce material cost of a print head.

The present invention provides a semiconductor device having a structure in which semiconductor layers are layered. The semiconductor device includes a light-emitting layer of a first conductivity type, a second conductivity type or non-doped type, a first contact layer of the second conductivity type disposed above the light-emitting layer and supplied with a voltage via a predetermined contact, a second contact layer of the second conductivity type disposed below the light-emitting layer and supplied with a voltage via a predetermined contact, a first etching stopper layer of the first or second conductivity type disposed below the light-emitting layer and above the second contact layer so that the first etching stopper layer allows selective etching for the second contact layer, and a third contact layer of the first conductivity type disposed below the second contact layer and supplied with a voltage via a predetermined contact.

Since the semiconductor device is configured as above, the material cost of the print head can be reduced. In particular, the sizes of chips and driving circuits can be reduced, and therefore the material cost of the chips and the cost of the driving circuits can be reduced.

BRIEF DESCRIPTION OF THE DRAWINGS

In the attached drawings:

FIG. 10 is a sectional view illustrating the structure of the composite semiconductor device of FIG. 8, taken along line 10-10 in FIG. 8;

FIG. 11A is a sectional view illustrating the structure of a semiconductor thin-film according to the fourth embodiment;

FIG. 12 is a plan view illustrating the structure of a composite semiconductor device according to the fifth embodiment;

DETAILED DESCRIPTION OF THE PREFERRED EMBODIMENT

Embodiments of the present invention will be described with reference to the attached drawings.

First Embodiment

Description will be made to a composite semiconductor device having a thyristor structure, a composite semiconductor device having a light-emitting element of three-terminal structure and a control circuit for controlling the light-emission of the light-emitting element, a print head having the composite semiconductor device (used in, for example, an electrophotographic printer), and an image forming apparatus having the print head.

Figure 1:
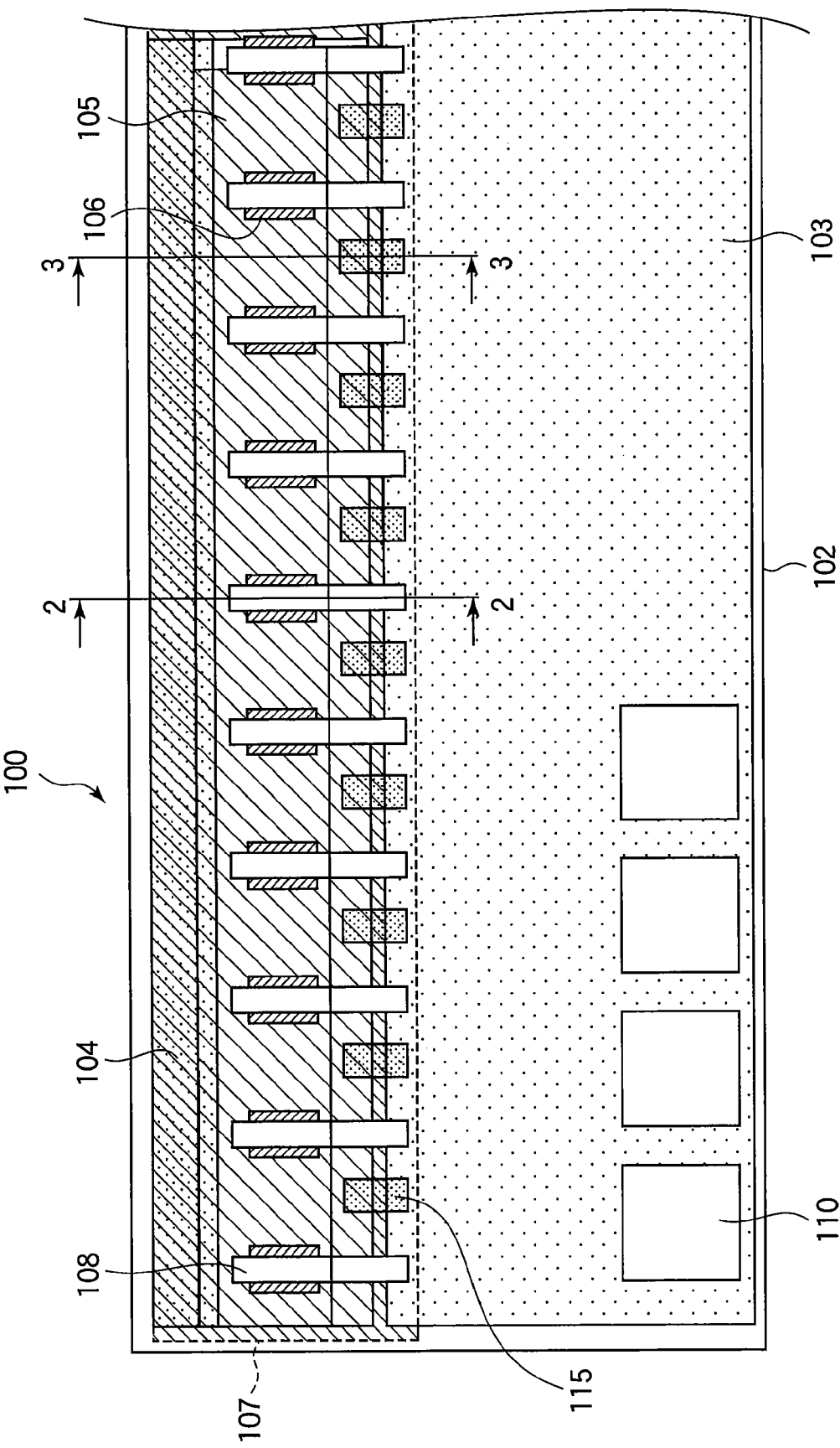
FIG. 1 is a plan view illustrating the structure of a composite semiconductor device according to the first embodiment of the present invention.
Figure 2:
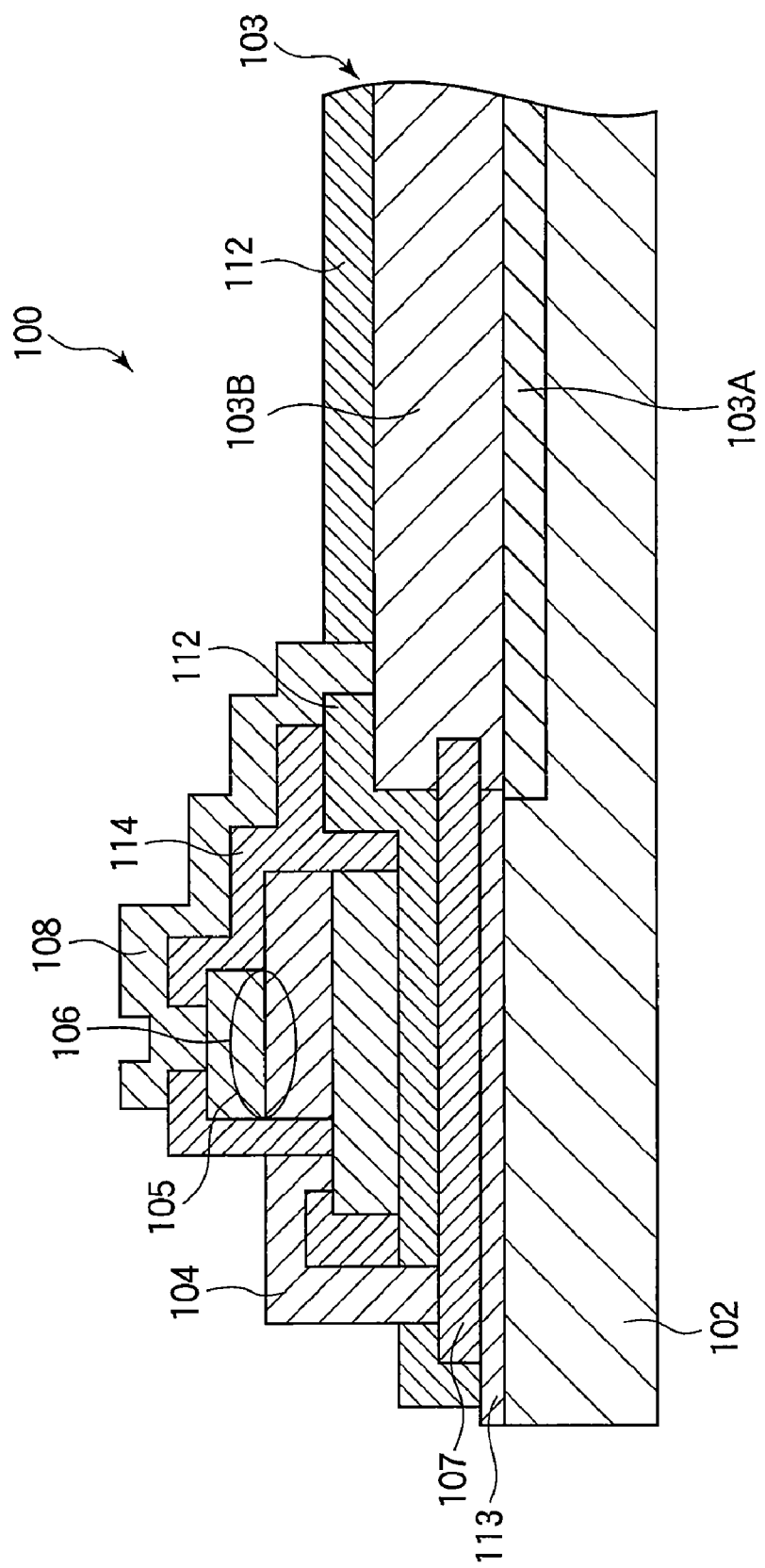
FIG. 2 is a sectional view illustrating the structure of the composite semiconductor device of FIG. 1, taken along line 2-2 in FIG. 1.
Figure 3:
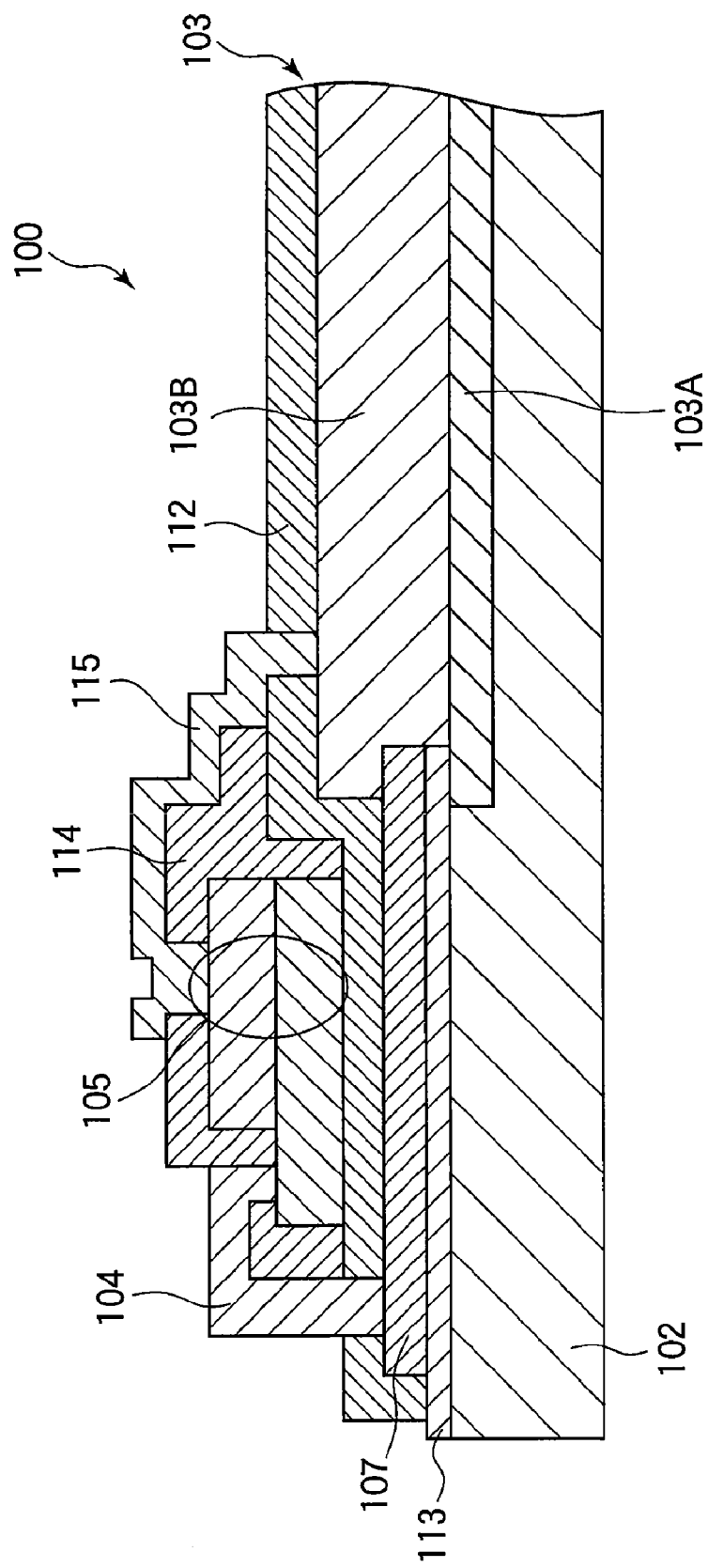
FIG. 3 is a sectional view illustrating the structure of the composite semiconductor device of FIG. 1, taken along line 3-3 in FIG. 1.

FIG. 1 is a plan view of a composite semiconductor device according to the first embodiment. FIGS. 2 and 3 are sectional views of the composite semiconductor device of FIG. 1, respectively taken along line 2-2 and line 3-3 in FIG. 1.

The composite semiconductor device 100 of the first embodiment includes a first substrate 102, a circuit region 103 for controlling the light-emission of a light-emitting element on the first substrate 102, a conductive layer 104 formed on the first substrate 102, a semiconductor thin-film 105 (as a semiconductor device) electrically connected to the conductive layer 104, a plurality of light-emitting regions 106 (as light-emitting elements) formed on the semiconductor thin-film 105, a reflection layer 107 formed on the first substrate 102, individual electrodes 108 for controlling the light-emission of the respective light-emitting regions 106, connection pads 110 for input and output of driving signals with the circuit region 103, a passivation film 112, an interlayer insulation film 113 having insulation property, an interlayer insulation film 114 that insulates the conductive layer 104 and the individual electrodes 108 from each other, and conductive layers 115 (FIG. 1) having electric conductivity.

The first substrate 102, on which the circuit region 103 and the interlayer insulation layer 113 are formed, is electrically connected to the conductive layer 104. The first substrate 102 is formed of, for example, single-crystal Si. It is also possible that the first substrate 102 contains polysilicon, amorphous silicon, organic semiconductor material or the like.

The circuit region 103 is formed on the first substrate 102, and is formed of the same semiconductor materials as the first substrate 102. The circuit region 103 is electrically connected to the semiconductor thin-film 105 using the method described later. The circuit region 103 sends a predetermined logic signal to the semiconductor thin-film 105 to thereby control the light-emission of the light-emitting region.

The circuit region 103 includes a circuit element region 103A formed therein and a region 103B including wiring regions electrically connecting the respective elements of the circuit element region 103A. The circuit region 103 controls the light-emission of the light-emitting regions 106 formed on the semiconductor thin-film 105. The circuit element region 103A is formed on the first substrate 102, and includes circuit elements such as a transistor, resistance, capacitor or the like. The region 103B is formed on the circuit element region 103A, and electrically connects the respective elements of the circuit element region 103A to each other to thereby constitute a circuit. The region 103B has a layered structure including wirings for connecting the elements of the circuit element region 103A to each other, input/output lines for sending electric power or signal, wirings for connecting the input/output lines to input/output portions, and wirings for connecting the circuit region 103 and the reflection layer 107, or the like.

The conductive film 104 is electrically connected to the reflection layer 107. The conductive film 104 is provided for applying the electric power (supplied by the circuit region 103 via the reflection layer 107) to the semiconductor thin-film 105 via the contact layer (described later) of the semiconductor thin-film 105. The conductive film 104 is composed of one of or any combination of, for example, Al, AlSiCu, NiAl, Ti, Cu, TiPtAu, AuGeNi, NiGe, Pd, Cr, Au, CrPd and NiPd, in the form of a single layer, laminated layers or an alloy layer.

The semiconductor thin-film 105 includes, for example, semiconductor layers formed by epitaxial growth on the GaAs substrate (as a base material) different from the first substrate 102, and separated (peeled off) from the GaAs substrate. For example, the semiconductor thin-film 105 has a layered structure in which $Al_xGa_{1-x}As$ ($0 \leq x \leq 1$) layers are appropriately layered. The structure of the semiconductor thin-film 105 will be described later.

The light-emitting regions 106 constitute, for example, an array of light-emitting elements arranged along a line at constant intervals on the semiconductor thin-film 105. The light-emitting regions 106 are formed by layering a plurality of semiconductor layers. The structure of the light-emitting regions 106 will be described later together with the structure of the semiconductor thin-film 105. The present invention is not limited to the structure in which the light-emitting elements are arranged at constant intervals.

The reflection layer 107 is disposed on the first substrate 102 via the interlayer insulation layer 113. The reflection layer 107 has a certain reflection coefficient, and reflects the light emitted by the semiconductor thin-film 105. The reflection layer 107 is formed of a metal layer, and is composed of one of or any combination of Al, Si, Cu, Ni, Cr, Pd, Pt, Au, Ge and Ti in the form of a single layer, a laminated layers, or an alloy layer. If the reflection layer 107 is not utilized as the conductive layer (as described in this embodiment), the reflection layer 107 can be formed of a layered structure of dielectric layers, a layered structure of a semiconductor layer and an oxide layer, or a layered structure of oxide layers. Further, the reflection layer 107 has a function to reflect the light emitted by the light-emitting region 106, in addition to the function to electrically connect the respective components.

The individual electrodes 108 are formed by a semiconductor photolithographic process including photo-etching. The individual electrodes 108 electrically connect the semiconductor thin-film 105 and the circuit region 103. The connection pads 110 are provided for input and output of electric power, ground potential or driving signal with the circuit region 103. The thickness of the connection pad 110 is in the range from 0.05 μm to 2.5 μm and is preferably 0.5 μm. The conductive layers 115 electrically connect other contact layers on the surface of the semiconductor thin-film 105 to the circuit region 103.

The passivation film 112 is formed on the reflection layer 107 and the circuit region 103. The passivation film 112 prevents the damage on the surfaces of the reflection layer 107 and the circuit region 103, and enhances the contact between the semiconductor thin-film 105 and the first substrate 102.

The interlayer insulation layer 113 is formed appropriately by means of an electrical circuit design. The interlayer insulation layer 113 can be configured to electrically insulate the first substrate 102 and the conductive layer 104 from each other. The interlayer insulation layer 114 is formed between the conductive layer 104 and the individual electrodes 108, and has insulation property. The interlayer insulation layer 114 electrically insulates the conductive layer 104 and the individual electrodes 108 from each other.

The conductive layer 115 is electrically connected to the reflection layer 107. The conductive layer 115 is supplied with the electric power via the circuit region 103, and applies the voltage to the semiconductor thin-film 105 via a contact layer of the semiconductor thin-film 105 (described layer) which is different from the contact layer connected to the conductive layer 104. The conductive layer 104 is formed of one of or any combination of, for example, Al, AlSiCu, NiAl, Cu, TiPtAu, AuGeNi, NiGe, Ti, Pd, CrAu, CrAu, CrPd and NiPd, in the form of a single layer, laminated layers or an alloy layer.

Figure 4A:
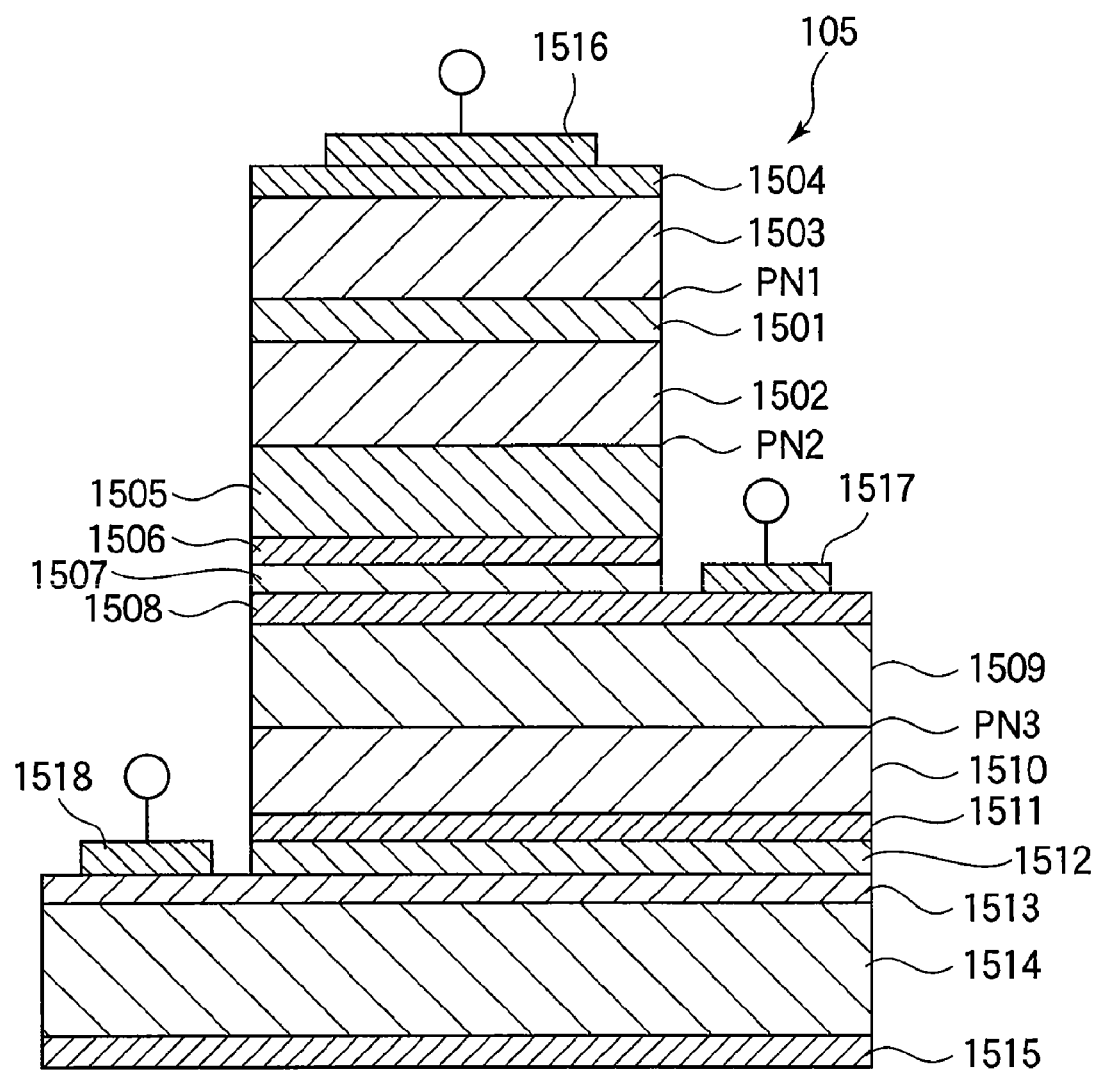
FIG. 4A is a sectional view illustrating the structure of a semiconductor thin-film provided in the composite semiconductor device of the first embodiment.
Figure 4B:
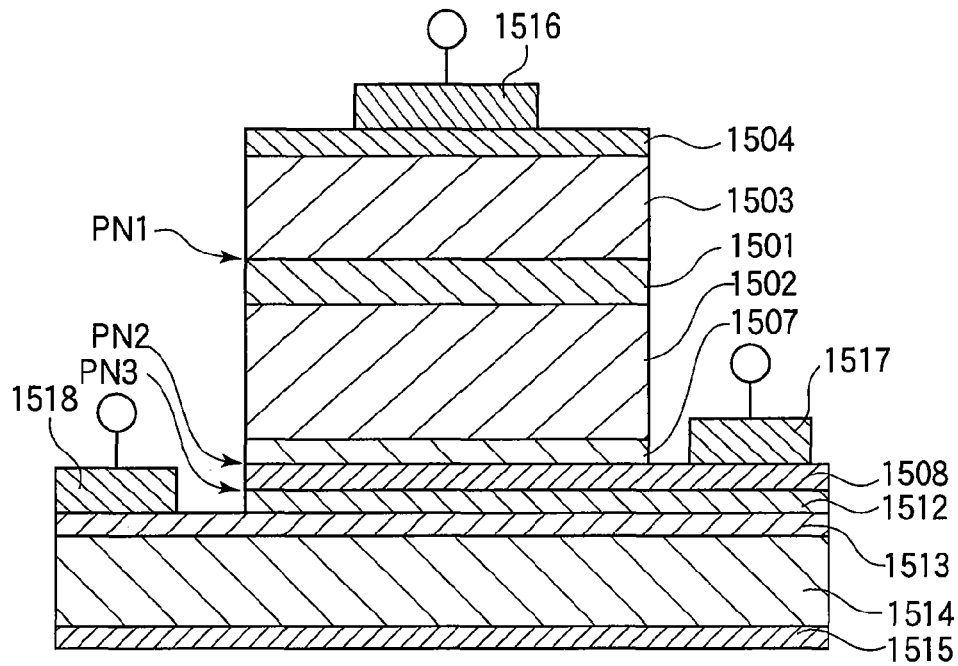
FIG. 4B is a sectional view illustrating a modification of the semiconductor thin-film provided in the composite semiconductor device of the first embodiment.

Hereinafter, the structure of the semiconductor thin-film 105 will be described in detail. FIGS. 4A and 4B are sectional views showing the structure of the semiconductor thin-film 105.

The semiconductor thin-film 105 is a semiconductor layer in the form of a thin-film. The thickness of the semiconductor thin-film 105 is in the range from 0.1 μm to 10 μm, and preferably 2 μm. If the thickness of the semiconductor thin-film 105 is thicker than 10 μm, the disconnection of the individual wiring layers 104 and 108 (formed by a photolithographic process) may occur due to the difference in level. By setting the thickness of the semiconductor thin-film 105 thinner than or equals to 10 μm, the wiring layers connected to the elements on the semiconductor thin-film 105 can be formed by photolithographic process. Due to the fine processing, the wiring layers can be formed in a small area and can be collectively formed with high yield rate. The thickness of the semiconductor thin-film 105 is preferably thicker than or equals to 0.1 μm, because it becomes difficult to handle the semiconductor thin-film 105 if the thickness thereof is thinner than 0.1 μm.

The semiconductor thin-film 105 is electrically connected to the conductive layer 104, the individual electrodes 108 and the conductive layer 115, and constitutes a three-terminal structure. The semiconductor thin-film 105 includes an active layer 1501 (as a light-emitting layer) of a first conductivity type, a lower cladding layer 1502 (as a first semiconductor layer) of the first conductivity type formed below the active layer 1501, and an upper cladding layer 1503 (as a second semiconductor layer) of a second conductivity type formed on the active layer 1501. Further, the semiconductor thin-film 105 includes a first contact layer 1504 of the second conductivity type formed on the upper cladding layer 1503, a joining layer 1505 of the second conductivity type formed below the lower cladding layer 1502, a separation layer 1506 of the second conductivity type formed below the joining layer 1505, a first etching stopper layer 1507 of the second conductivity type formed below the separation layer 1506, and a second contact layer 1508 of the second conductivity type formed below the first etching stopper layer 1507. Further, the semiconductor thin-film 105 includes a joining layer 1509 (as a third semiconductor layer) of the second conductivity type formed below the second contact layer 1508, a joining layer 1510 of the first conductivity type formed below the joining layer 1509, a separation layer 1511 of the first conductivity type formed below the joining layer 1510, and a second etching stopper layer 1512 of the first conductivity type formed below the separation layer 1511. Further, the semiconductor thin-film 105 includes a third contact layer 1513 of the first conductivity type formed below the second etching stopper layer 1512, a conductive layer 1514 (as a fourth semiconductor layer) of the first conductivity type formed below the third contact layer 1513, and a bonding layer 1515 of the first conductivity type formed below the conductive layer 1514. An anode electrode 1516 is formed on the first contact layer 1504, and is electrically connected to the individual electrode 108. A gate electrode 1517 is formed on the second contact layer 1508, and is electrically connected to the conductive layer 115. A cathode electrode 1518 is formed on the third contact layer 1513, and is electrically connected to the conductive layer 104.

In the following detailed description, the first conductivity type will be described as n-type, and the second conductivity type will be described as p-type, for convenience of description. However, it is also possible that the first conductivity type is n-type, and the second conductivity type is p-type.

The respective layers of the semiconductor thin-film 105 are composed of semiconductor layers of predetermined compounds. The active layer 1501 (as the light-emitting layer) is composed of, for example, an n-type $Al_yGa_{1-y}As$ layer. The lower cladding layer 1502 (as the first semiconductor layer) is composed of, for example, an n-type $Al_xGa_{1-x}As$ layer. The upper cladding layer 1503 (as the second semiconductor layer) is composed of, for example, a p-type $Al_zGa_{1-z}As$ layer. The first contact layer 1504 is composed of, for example, a p-type GaAs layer. When the semiconductor thin-film 105 constitutes a thyristor structure, the first contact layer 1504 constitutes an anode electrode of the thyristor structure. The joining layer 1505 is composed of, for example, a p-type $Al_{U2}Ga_{1-U2}As$ layer. The separation layer 1506 is composed of, for example, a p-type GaAs layer. The first etching stopper layer 1507 is composed of, for example, a p-type $In_vGa_{1-v}P$ layer. The second contact layer 1508 is composed of, for example, a p-type GaAs layer. The second contact layer 1508 constitutes a gate electrode of the thyristor structure. The joining layer 1509 is composed of, for example, a p-type $Al_{u1}Ga_{1-u1}As$ layer. The joining layer 1510 is composed of, for example, an n-type $Al_{t1}Ga_{1-t1}As$ layer. The separation layer 1511 is composed of, for example, an n-type GaAs layer. The second etching stopper layer 1512 is composed of, for example, an n-type InGaP layer. The third contact layer 1513 is composed of, for example, an n-type GaAs layer. The third contact layer 1513 constitutes a cathode electrode of the thyristor structure. The conductive layer 1514 is composed of, for example, an n-type $Al_sGa_{1-s}As$ layer. The bonding layer 1515 is composed of, for example, an n-type GaAs layer.

It is preferable that the above described compositions s, t1, u1, u2, x, y and z of the respective semiconductor layers satisfy the following relationships:

$1 \geq x \geq 0;$ $1 \geq z > y \geq 0;$ and $1 \geq s, t1, u1, u2 > y \geq 0.$ These relationships show that each of the energy band gaps of the upper cladding layer 1503 and the lower cladding layer 1502 is larger than at least the energy band gap of the active layer 1501, and show that each of the energy band gaps of the conductive layer 1514, the joining layer 1510, the joining layer 1509 and the joining layer 1505 is larger than at least the energy band gap of the active layer 1501. In this case, the composition v of the $In_vGa_{1-v}P$ layer preferably satisfies $0.48 \leq v \leq 0.52$.

To be more specific, the efficiency of the light-emission can be enhanced, when the following relationships are satisfied:

$1 \geq x \geq 0;$ and $1 \geq z > y \geq 0.$

Further, it is possible to prevent the light from being absorbed by the conductive layer, when the following relationship is satisfied:

$s > y.$

Furthermore, it is possible to restrict the light-emission from a region other than the light-emitting region 106 (so that the light-emission is mainly caused by carrier injection across the pn-junction including the active layer 1501), when the following relationship is satisfied:

$1 \geq s, t1, u1, u2 > y \geq 0.$

In order to prevent the light-emission from the region other than the light-emitting region 106 so that the light is mainly emitted by the light-emitting region 106 (i.e., the light-emission is mainly caused by carrier injection across the pn-junction including the active layer 1501), the compositions t1, u1 and u2 can be so selected that the respective semiconductor layers are of indirect-transition type. If the compositions are so selected that the respective semiconductor layers are of indirect-transition type, there is a large possibility that the carrier recombination is non-radiative (even when the carrier recombination occurs in the semiconductor layer), and therefore the possibility of light-emission decreases. In the case of AlGaAs for example, it is preferable to satisfy the following conditions: y=0.1, X=0.4, and (s, t1, u1 and u2)>0.1.

In the above described structure, the pn-junction is formed at a boundary between the upper cladding layer 1503 and the active layer 1501. However, it is also possible to form the pn-junction at a boundary between the active layer 1501 and the lower cladding layer 1502. In other words, the active layer 1501 can be composed of a p-type $Al_yGa_{1-y}As$ layer. Alternatively, the active layer 1501 can be a non-doped semiconductor layer. In this specification, the term "non-doped semiconductor layer" is used to mean the semiconductor layer formed by epitaxial growth without doping impurities, i.e., the semiconductor layer whose density of p-type or n-type impurities is at a lower level than the semiconductor layer formed by doping impurities.

The above configured semiconductor thin-film 105 constitutes the thyristor structure having three terminal structure including the anode electrode 1516, the gate electrode 1517 and the cathode electrode 1518. To be more specific, the first contact layer 1504 is connected to the individual electrode 108 via the anode electrode 1516, the second contact layer 1508 is connected to the conductive layer 115 via the gate electrode 1517, and the third contact layer 1513 is connected to the conductive layer 104 via the cathode electrode 1518. Further, three pn-junctions are formed on the semiconductor thin-film 105: a pn-junction PN1 formed at a boundary between the active layer 1501 (i.e., the light-emitting region 106) and the upper cladding layer 1503, a pn-junction PN2 formed at a boundary between the lower cladding layer 1502 (i.e., the joining region) and the joining layer 1505, and a pn-junction PN3 formed at a boundary between the joining layer 1509 and the joining layer 1510. With the pn-junctions PN1, PN2 and PN3, the semiconductor thin-film 105 constitutes a thyristor structure as a whole. In this embodiment, the thyristor structure of a quadruple structure having pnpn-junctions is described. However, it is also possible to use the thyristor structure of a quadruple structure having npnp junctions.

Hereinafter, the function of the composite semiconductor device 100 will be described.

For example, the cathode electrode 1518 is grounded, and the anode electrode 1516 is applied with positive (+) electrical potential. When the applied voltage is small, the pn-junction PN2 is applied with a reverse bias, and therefore the resistance between the cathode electrode 1518 and the anode electrode 1516 is large. As the applied voltage increases, a high electric field causes the avalanche of electrons, so that the electrons and positive holes are generated in the vicinity of the pn-junction PN2. The electrons move toward the anode electrode 1516, and the positive holes move toward the cathode electrode 1518. However, a part of the electrons stays at the pn-junction PN1, and a part of the positive holes stays at the pn-junction PN3, with the result that a forward bias state between the pn-junction PN1 and the pn-junction PN3 is increased. In this state, positive holes are introduced into the active layer 1501 of the first conductivity type, and electrons are introduced into the second contact layer 1508. The positive holes are introduced into the lower cladding layer 1502, the electors are introduced into the joining layer 1505, and the number of carriers increases due to the high electric field in the vicinity of the pn-junction PN2. As a result, the pn-junction PN2 becomes unable to maintain high electric field, and therefore all of the pn-junctions become forward bias state, so that current flows between the cathode electrode 1518 and the anode electrode 1516. The ON voltage can be changed by an introducing current $I_G$ from the electrode 1517. Therefore, by controlling the introducing current $I_G$, the ON voltage between the anode electrode 1516 and the cathode electrode 1518 can be controlled. By controlling the ON voltage between the anode electrode 1516 and the cathode electrode 1518 using the circuit region 103, the light-emission of the light-emitting elements can be controlled. In other words, the semiconductor thin-film 105 (having the light-emitting elements) can have a function to switch ON and OFF the light-emission itself.

To explain it simply, by applying the logic signal to the gate electrode 1517 between the anode electrode 1516 and the cathode electrode 1518, the thyristor is brought to the ON-state, and the voltage applied to the anode electrode 1516 causes the current to flow from the anode electrode 1516 to the cathode electrode 1518, with the result that the light is emitted from the active layer 1501. This ON-state is maintained until the voltage applied to the anode electrode 1516 is brought to the OFF-state. As the semiconductor thin-film 105 has the thyristor structure, the light-emission can be accomplished by applying the control signal (i.e., logic signal) to the gate electrode 1517 as long as the anode electrode 1516 is applied with energy (voltage) sufficient for driving the light-emitting elements, and therefore it is not necessary to provide separate driving circuits for the semiconductor thin-film 105. Thus, there is an advantage that circuits can be reduced, unlike LEDs that require separate driving circuits. As the separate driving circuits can be eliminated, the control circuits formed on the semiconductor thin-film 105 can be simplified. Further, if the circuit region 103 on the first substrate 102 is provided with a specific function (i.e., shifting of switches, processing of light-emission data, or the like), the semiconductor thin-film 105 and the circuit region 103 on the first substrate 102 can share the function to control the light-emission, and therefore the load of the circuit configuration on the first substrate 102 can be reduced.

As described above, using the above configured composite semiconductor device 100, the respective elements can be connected to each other via the thin-film wiring, without using bonding-wires. Thus, the connection wirings can be drastically reduced, and the chip size can be drastically reduced. Further, as the semiconductor thin-film 105 has the thyristor structure, the circuit region 103 can be simplified, and therefore a significant cost reduction can be accomplished.

Additionally, in the semiconductor layered structure of the semiconductor thin-film 105, the semiconductor layers forming the pn-junction PN2 have larger energy band gap than that of the active layer 1501 forming the pn-junction PN1 of the light-emitting region 106, and are preferably made of indirect-transition type semiconductor materials. Furthermore, the semiconductor layer (i.e., the lower cladding layer 1502) whose energy band gap is larger than the energy band gap of the active layer 1501 is disposed below the active layer 1501. For these reasons, it becomes possible to restrict the light-emission from other region than the light-emitting region, when the three-terminal element is in the ON-state.

Moreover, due to the three-terminal structure with the electrode contact layers and the etching stopper layers, the thickness of the respective contact layers can be reduced, and the light absorption at the respective contact layers can be small. Additionally, since the reflection layer 107 that does not absorb the light is provided as the bottom layer, it becomes possible to prevent the absorption of the light emitted from the backside, without increasing the whole resistance. Therefore, the efficiency of the light-emission can be enhanced.

The layered structure of the semiconductor thin-film 105 can be modified as follows. It is possible to omit any one layer, any two layers or three layers of the joining layer 1505, 1509 and 1510. It is also possible to omit any of or both of the separation layers 1506 and 1511. Further, it is also possible to appropriately employ the modification in which the first etching stopper layer 1507 is of the second conductivity type and the separation layer 1506 is of the first conductivity type. Additionally, it is also possible to omit the joining layer 1505 and the separation layer 1506, to modify the first etching stopper layer 1507 to the first conductivity type, and to form the pn-junction PN2 between the p-type semiconductor and the n-type semiconductor at the boundary of the first etching stopper layer 1507 of the first conductivity type and the second contact layer 1508 of the second conductivity type. It is also possible to omit the bonding layer 1515. Moreover, in the above described structure, although the semiconductor thin-film 105 is formed of materials including AlGaAs or InGaP, it is also possible to use other material to form the three-terminal structure. To be more specific, it is possible to use one of or any combination of $GaAs_{1-x}N_x$, $GaP_{1-x}N_x$, $InAs_{1-x}N_x$, $InP_{1-x}N_x$, $InGa_{1-x}As_{1-y}N_y$, $InP_{1-x-y}AsN_y$ or $In_xAl_{1-x}N$ ($1 \geq x \geq 0$, $1 \geq y \geq 0$). It is also possible to use $Al_xGa_yAs_{1-x-y}P$, $Al_xGa_yIn_{1-x-y}P$ ($1 \geq x \geq 0$, $1 \geq y \geq 0$) or the like. It is also possible to use oxide semiconductor material such as ZnO or the like.

In particular, as shown in FIG. 4B, the semiconductor thin-film is formed by layering the bonding layer 1515, the conductive layer 1514 of the first conductivity type, the third contact layer 1513 of the first conductivity type, the second etching stopper layer 1512 of the first conductivity type, the second contact layer 1508 of the second conductivity type, the first etching stopper layer 1507 of the first conductivity type, the lower cladding layer 1502 of the first conductivity type, the active layer 1501 of the first conductivity type, the upper cladding layer 1503 of the second conductivity type, and the first contact layer 1504 of the second conductivity type. Further, the anode electrode 1516 is connected to the first contact layer 1504, the gate electrode 1517 is connected to the second contact layer 1508, and the cathode electrode 1518 is connected to the third contact layer 1513. In this case, the pn-junctions are formed between the active layer 1501 of the first conductivity type and the upper cladding layer 1503 (the pn-junction PN1), between the first etching stopper layer 1507 and the second contact layer 1508 (the pn-junction PN2), and between the second contact layer 1508 and the second etching stopper layer 1512 (the pn-junction PN3).

Second Embodiment

A composite semiconductor device 200 according to the second embodiment of the present invention will be described. Regarding the components of the composite semiconductor device 200 that are the same as those of the composite semiconductor device 100 of the first embodiment, duplicate explanation will be omitted. The description will be made to the layered structure of the semiconductor layers constituting the semiconductor thin-film different from that of the first embodiment.

Figure 5:
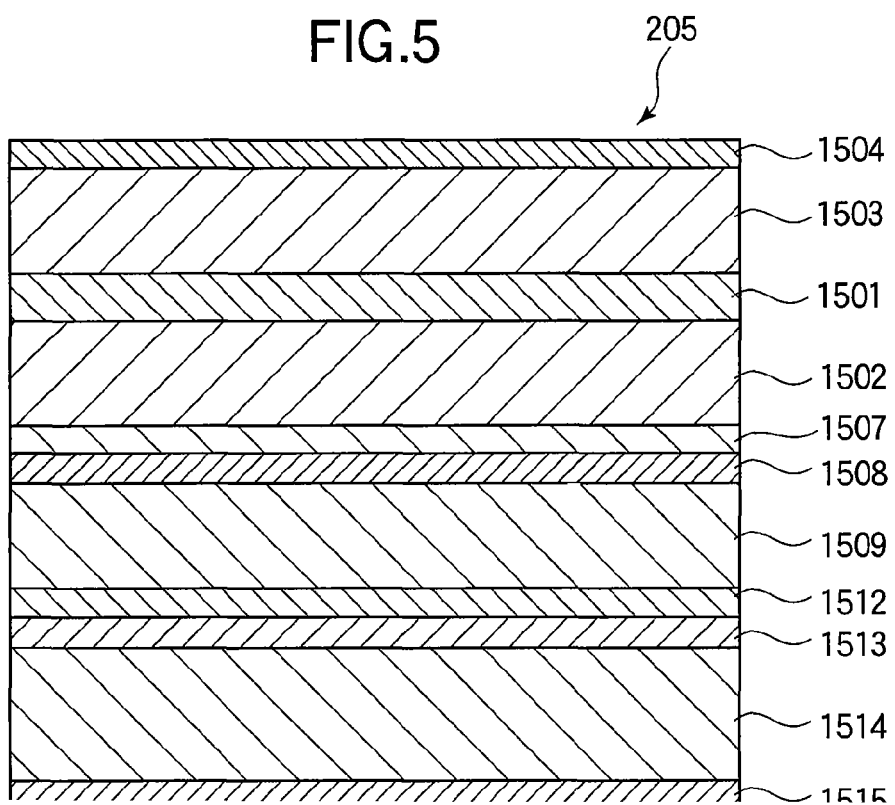
FIG. 5 is a sectional view illustrating the layered structure of the semiconductor thin-film according to the second embodiment.

FIG. 5 is a sectional view showing the structure of a semiconductor thin-film 205 of the composite semiconductor device 200.

The semiconductor thin-film 205 has the epitaxial structure. The semiconductor thin-film 205 includes the active layer 1501 of the first conductivity type (as the light-emitting layer), the lower cladding layer 1502 of the first conductivity type (as the first semiconductor layer), the upper cladding layer 1503 of the second conductivity type (as the second semiconductor layer), the first etching stopper layer 1507 of the first conductivity type, the second contact layer 1508 of the second conductivity type, the joining layer 1509 of the second conductivity type (as the third semiconductor layer), the second etching stopper layer 1512 of the first conductivity type, the third contact layer 1513 of the first conductivity type, the conductive layer 1514 of the first conductivity type, and the bonding layer 1515 of the first conductivity type.

These layers are described in the first embodiment, and therefore detailed description thereof is omitted.

The semiconductor thin-film 205 of the second embodiment is different from the semiconductor thin-film 105 of the first embodiment in that the first etching stopper layer 1507 has a larger energy band gap and that the joining layers 1505 and 1510 are omitted.

The above configured semiconductor thin-film 205 has a more simple structure than the semiconductor thin-film 105 of the first embodiment, and therefore the material cost can be reduced.

Third Embodiment

A composite semiconductor device 300 according to the third embodiment of the present invention will be described. Regarding the components of the composite semiconductor device 300 that are the same as those of the composite semiconductor device 100 of the first embodiment, duplicate explanation will be omitted. The description will be made to the layered structure of the semiconductor layers constituting the semiconductor thin-film different from that of the first embodiment.

Figure 6:
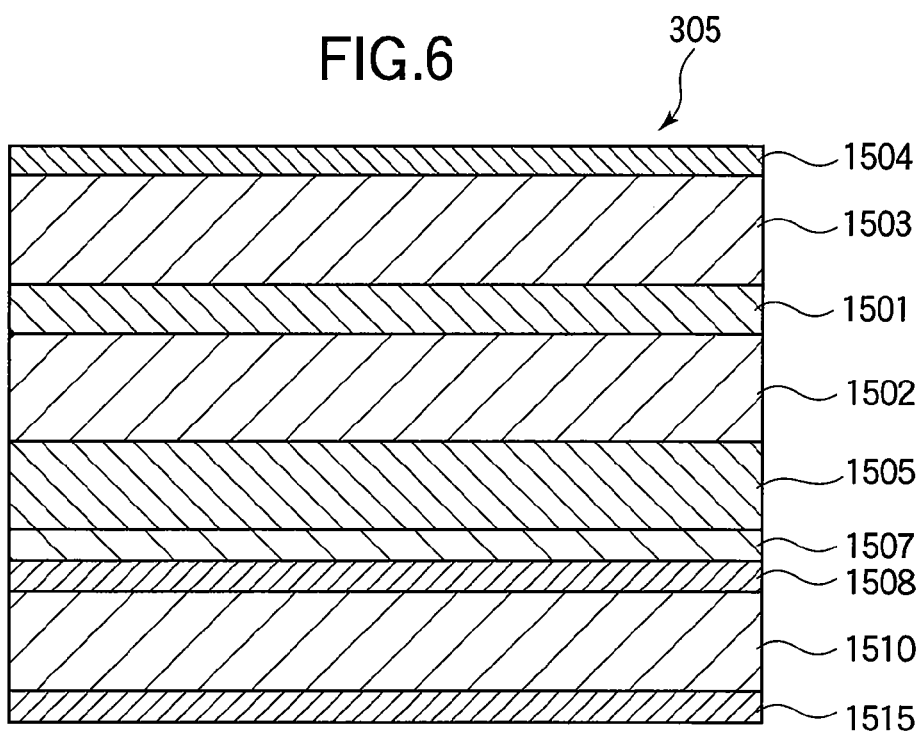
FIG. 6 is a sectional view illustrating the layered structure of the semiconductor thin-film according to the second embodiment.
Figure 7:
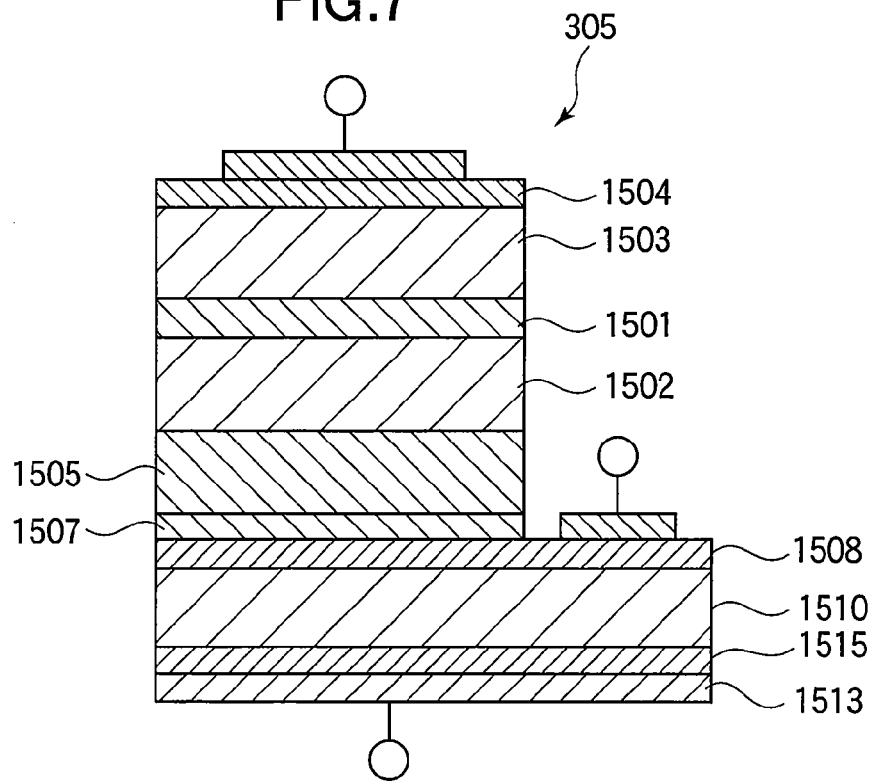
FIG. 7 is a sectional view illustrating the structure of a composite semiconductor device according to the second embodiment.

FIGS. 6 and 7 are sectional views of a semiconductor thin-film 305 of the composite semiconductor device 300. The semiconductor thin-film 305 has the epitaxial structure. The semiconductor thin-film 305 includes the active layer 1501 of the first conductivity type (as the light-emitting layer), the lower cladding layer 1502 of the first conductivity type (as the first semiconductor layer), the upper cladding layer 1503 of the second conductivity type (as the second semiconductor layer), the first contact layer 1504 of the second conductivity type, the joining layer 1505 of the first conductivity type, the first etching stopper layer 1507 of the first conductivity type, the second contact layer 1508 of the second conductivity type, the joining layer 1510 of the first conductivity type, and the third contact layer 1513 of the first conductivity type. These layers are described in the first embodiment, and therefore detailed description thereof is omitted. The active layer 1501 can be of the second conductivity type or non-doped type.

Figure 8:
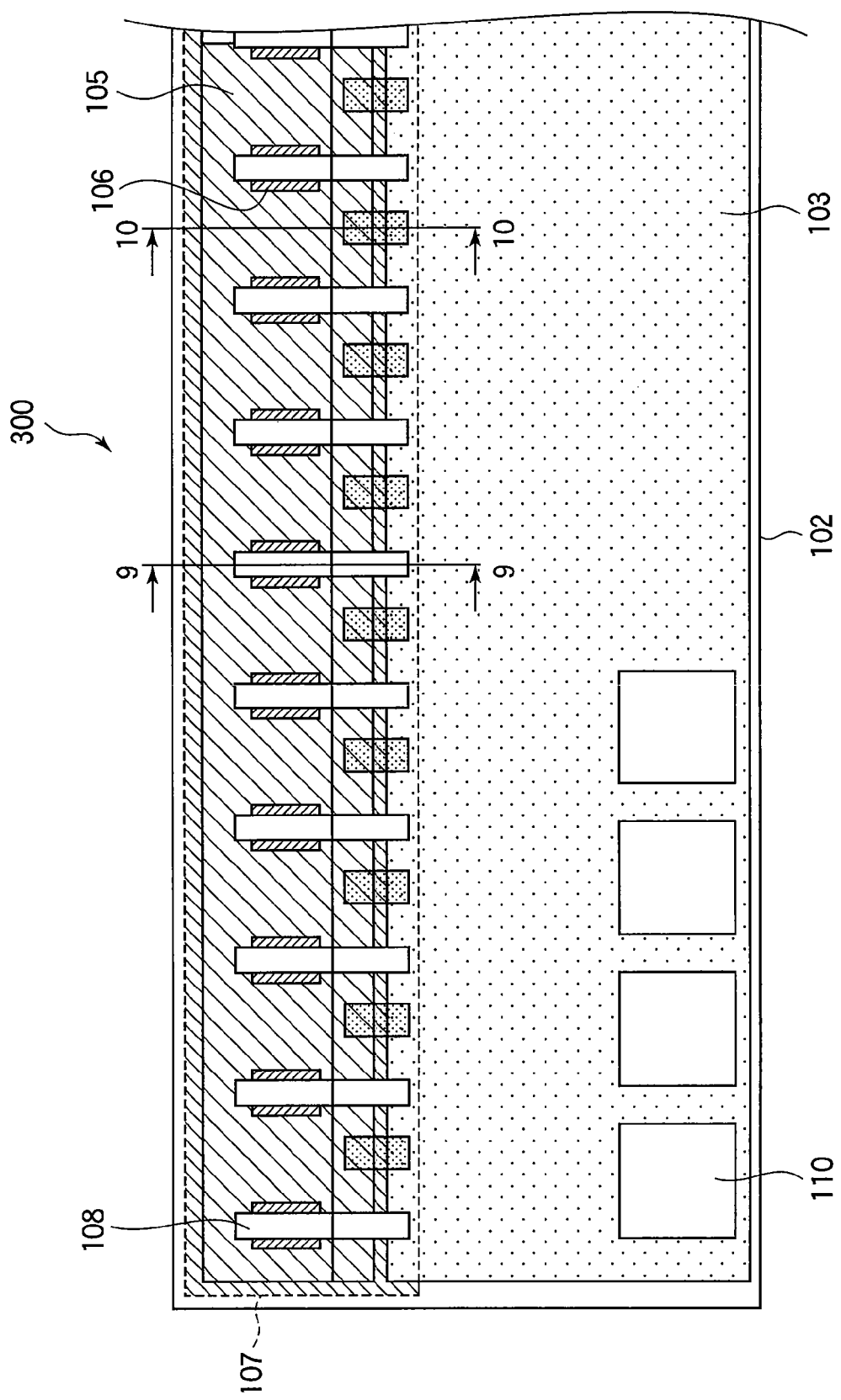
FIG. 8 is a plan view illustrating the structure of a composite semiconductor device according to the third embodiment.
Figure 9:
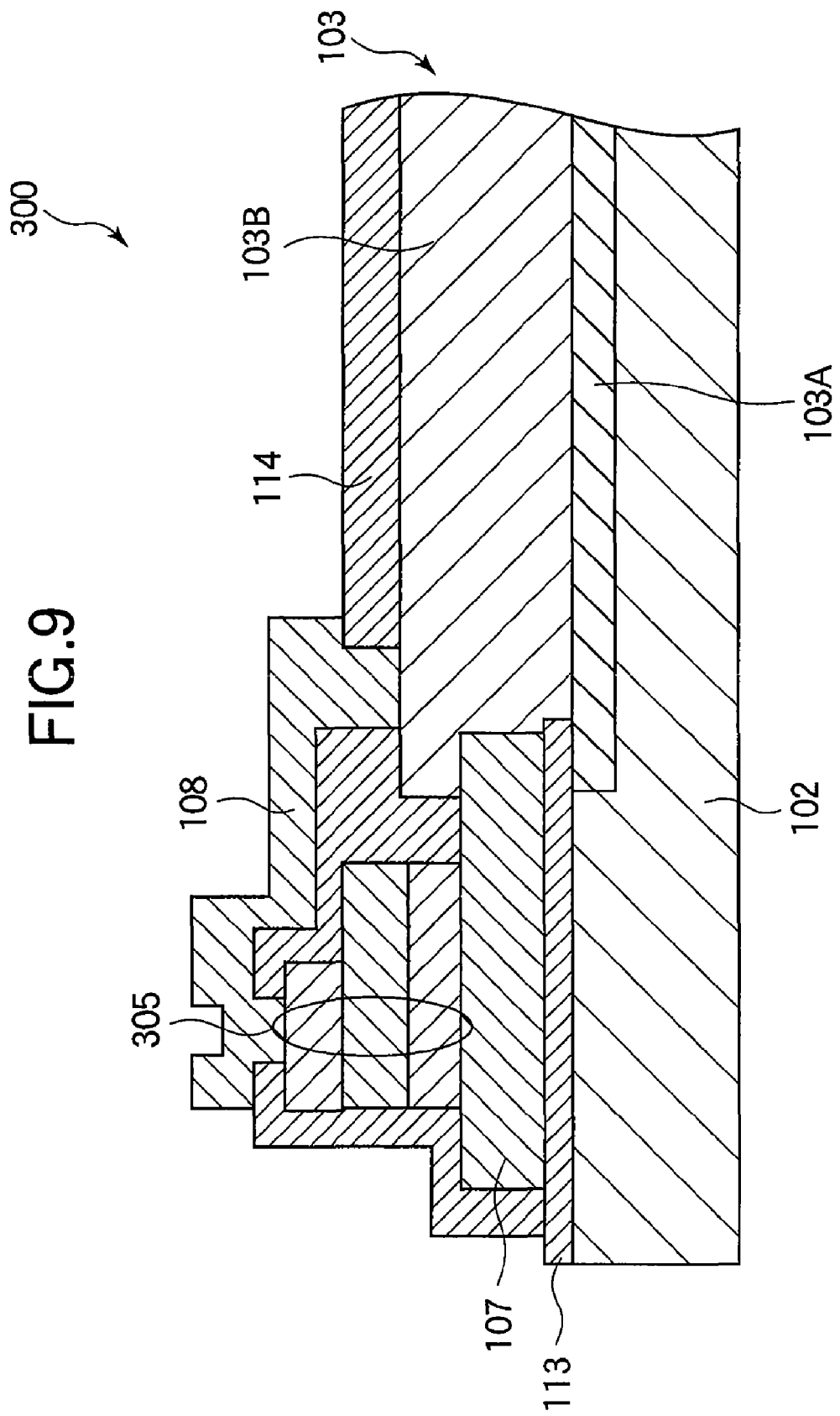
FIG. 9 is a sectional view illustrating the structure of the composite semiconductor device of FIG. 8, taken along line 9-9 in FIG. 8.

FIG. 8 is a plan view of the composite semiconductor device 300 according to the third embodiment. FIGS. 9 and 10 are sectional views of the composite semiconductor device 300 respectively taken along line 9-9 and line 10-10 in FIG. 8.

In the third embodiment, the semiconductor thin-film 305 is bonded onto the conductive layer 107 formed below the semiconductor thin-film 305 so that the semiconductor thin-film 305 and the conductive layer 107 are electrically connected to each other.

In the above configured semiconductor thin-film 305, the third contact layer 1513 is formed on the bottom (backside) of the semiconductor thin-film 305, and the semiconductor thin-film 305 and the conductive layer 107 are electrically connected to each other via the third contact layer 1513. Therefore, the layered structure of the semiconductor thin-film 305 can be simplified, and the connection wirings between the semiconductor thin-film 305 and the circuit elements on the first substrate 102 can be simplified.

Fourth Embodiment

A composite semiconductor device 400 according to the fourth embodiment of the present invention will be described. Regarding the components of the composite semiconductor device 400 that are the same as those of the composite semiconductor device 100 of the first embodiment, duplicate explanation will be omitted. The description will be made to the layered structure of the semiconductor layers constituting the semiconductor thin-film different from that of the first embodiment.

FIG. 11A is a sectional view showing the structure of a semiconductor thin-film 405 of the composite semiconductor device 400.

The semiconductor thin-film 405 includes the active layer 1501 of the first conductivity type, the lower cladding layer 1502 of the first conductivity type, the upper cladding layer 1503 of the first conductivity type, the first contact layer 1504 of the first conductivity type, the joining layer 1505 of the second conductivity type, the separation layer 1506 of the second conductivity type, the first etching stopper layer 1507 of the second conductivity type, the second contact layer 1508 of the second conductivity type, the joining layer 1509 of the second conductivity type, the joining layer 1510 of the first conductivity type, the separation layer 1511 of the first conductivity type, the third contact layer 1513 of the first conductivity type, the conductive layer 1514 of the first conductivity type, the bonding layer 1515 of the first conductivity type, the anode electrode 1516, the gate electrode 1517, the cathode electrode 1518, and a doped region 1519 in which impurities of the second conductivity type are doped (diffused or ion-planted). The doped region 1519 includes a first contact layer 1519a of the second conductivity type, a cladding layer 1519b of the second conductivity type, and an active layer 1519c of the second conductivity type.

The doped region 1519 is, for example, a selectively diffused region. The doped region 1519 includes a p-type contact layer 1519a, a p-type upper cladding layer 1519b and a p-type active layer 1519c. If the semiconductor thin-film 405 has the layered structure of AlGaAs layers, the p-type impurity is, for example, Zn. In this case, the lower cladding layer 1502, the active layer 1501, the upper cladding layer 1503, the first contact layer 1504, the second contact layer 1508, the third contact layer 1513 are all composed of n-type semiconductor layers, and a Zn-diffused region 1520 is selectively formed. The diffusion front reaches in the active layer 1519c.

In the above configured semiconductor film 405, the junction is selectively formed, and therefore the array of light-emitting elements can be formed to a high density.

Figure 11B:
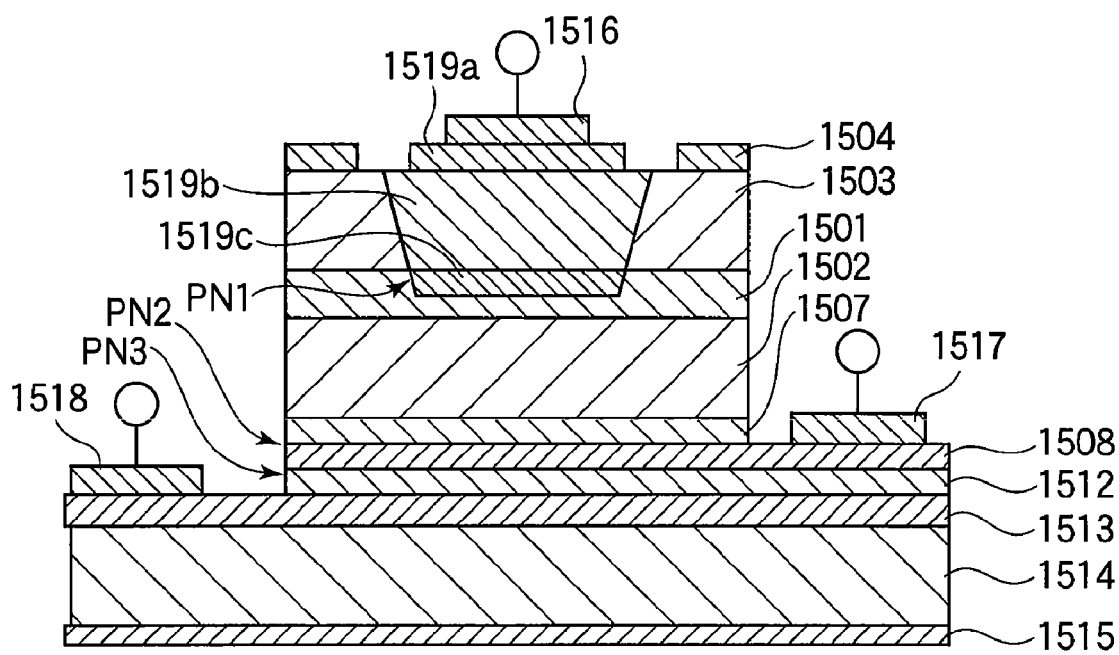
FIG. 11B is a sectional view illustrating a modification of the semiconductor thin-film according to the fourth embodiment.

FIG. 11B is a sectional view showing the modification of the fourth embodiment. It is possible to omit any one layer, any two layers or three layers of the joining layer 1505, 1509 and 1510. It is also possible to omit any one of or both of the separation layers 1506 and 1511. It is also possible to appropriately employ the modification in which the first etching stopper layer 1507 is of the second conductivity type and the separation layer 1506 is of the first conductivity type. It is also possible to omit the joining layer 1505 and the separation layer 1506, to modify the first etching stopper layer 1507 to the first conductivity type, and to form the pn-junction PN2 between the p-type semiconductor and n-type semiconductor at the boundary of the first etching stopper layer 1507 of the first conductivity type and the second contact layer 1508 of the second conductivity type. It is also possible to omit the bonding layer 1515. Although the example using materials including AlGaAs or InGaP has been described, it is also possible to use other material to form the three-terminal structure. To be more specific, it is possible to use one of or any combination of $GaAs_{1-x}N_x$, $GaP_{1-x}N_x$, $InAs_{1-x}N_x$, $InP_{1-x}N_x$, $InGa_{1-x}As_{1-y}N_y$, $InP_{1-x-y}AsN_y$, or $In_xAl_{1-x}N$ ($1 \geq x \geq 0$, $1 \geq y \geq 0$). It is also possible to use $Al_xGa_yAs_{1-x-y}P$, $Al_xGa_yIn_{1-x-y}P$ ($1 \geq x \geq 0$, $1 \geq y \geq 0$) or the like. It is also possible to use II to VI group semiconductor material. It is also possible to use oxide semiconductor material such as ZnO or the like.

In FIG. 11B, the semiconductor thin-film includes the first contact layer 1504 of the first conductivity type, the upper cladding layer 1503 of the first conductivity type, the active layer 1501 of the first conductivity type, the lower cladding layer 1502 of the first conductivity type, the first etching stopper layer 1507 of the first conductivity type, the second contact layer 1508 of the second conductivity type, the second etching stopper layer 1512 of the first conductivity type, the third contact layer 1513 of the first conductivity type, the conductive layer 1514 of the first conductivity type, the bonding layer 1515 of the first conductivity type, the anode electrode 1516, the gate electrode 1517, the cathode electrode 1518, and the doped region 1519 in which impurities of the second conductivity type are doped (diffused or ion-planted). The doped region 1519 includes the first contact layer 1519a of the second conductivity type, the upper cladding layer 1519b of the second conductivity type, and the active layer 1519c of the second conductivity type.

Fifth Embodiment

A composite semiconductor device 500 according to the fifth embodiment of the present invention will be described. Regarding the components of the composite semiconductor device 500 that are the same as those of the composite semiconductor device 100 of the first embodiment, duplicate explanation will be omitted. The description will be made to a bonding region for the semiconductor thin-film different from that of the first embodiment.

Figure 13:
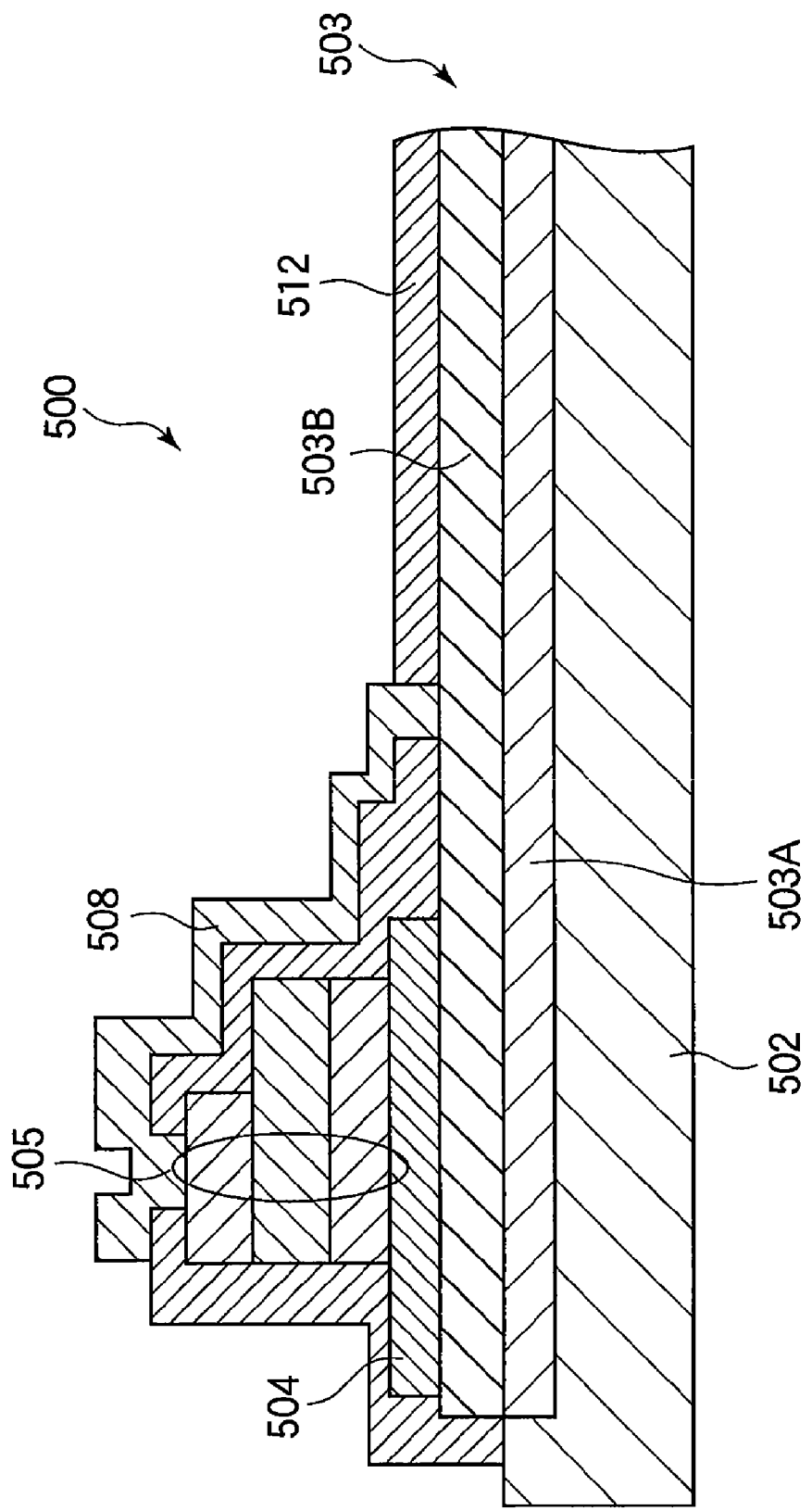
FIG. 13 is a sectional view illustrating the structure of the composite semiconductor device of FIG. 12, taken along line 13-13 in FIG. 12.

FIG. 12 is a plan view showing the structure of the composite semiconductor device 500 of the fifth embodiment. FIG. 13 is a sectional view of the composite semiconductor device 500 taken along line 13-13 in FIG. 12.

The composite semiconductor device 500 includes a first substrate 502, a circuit region 503 for controlling the light-emission of light-emitting elements on the first substrate 502, a conductive layer 504 formed on the first substrate 502, a semiconductor thin-film 505 electrically connected to the conductive layer 504, a plurality of light-emitting regions 506 formed on the semiconductor thin-film 505, individual electrodes 508 for controlling the light-emission of the respective light-emitting regions 506, connection wirings 509 that form electrical contacts with other electrode contact layers on the surface of the semiconductor thin-film 505, connection pads 510 for input and output of the driving signal with the circuit region 503, and a passivation film 512. The circuit region 503 is composed of circuit elements 503A and wiring regions 503B connecting the respective circuit elements 503A to each other.

The conductive layer 504 is formed on the circuit region 503, and the semiconductor thin-film 505 is bonded onto the conductive layer 504. The connection wirings 509 are connected to the circuit elements 503A on the first substrate 502 via the wiring regions 503B of the circuit region 503.

In the above configured composite semiconductor device 500, the semiconductor thin-film 505 is bonded onto the circuit element region 503 on the first substrate 502, and therefore the width of the composite semiconductor device 500 can be reduced.

In the above described first to fifth embodiments, the material of the semiconductor thin-film is described to be $Al_xGa_{1-x}As$. However, it is also possible to use other semiconductor material such as InAlGaP, InGaAsP, InP, InAlN, InGaN, AlGaN, or GaN.

Further, the conductive layer on the backside of the semiconductor thin-film can be composed of metal, or can be made of transparent electrode of ITO, ZnO or the like. Furthermore, it is possible to connect the individual electrodes to the circuit element region via the upper side of the semiconductor thin-film without using the conductive layer. The individual electrodes are not necessarily provided on the upper side of the semiconductor thin-film. In such a case, it is possible to dispose the connection pads on the same side as the light-emitting elements so that the connection pads can be bonded to the outside of the chip. These configurations can be variously modified in accordance with the design of the composite semiconductor device.

Sixth Embodiment

A composite semiconductor device 600 according to the sixth embodiment of the present invention will be described. Regarding the components of the composite semiconductor device 600 that are the same as those of the composite semiconductor device 100 of the first embodiment, duplicate explanation will be omitted. The description will be made to the circuit region and the semiconductor thin-film different from those of the first embodiment.

In the first embodiment, the circuit elements of the circuit region 103 are formed on the first substrate as the base material. In contrast, in the sixth embodiment, circuit elements of a circuit region are formed in a semiconductor layer 603 that is different from a semiconductor thin-film 605.

Figure 14:
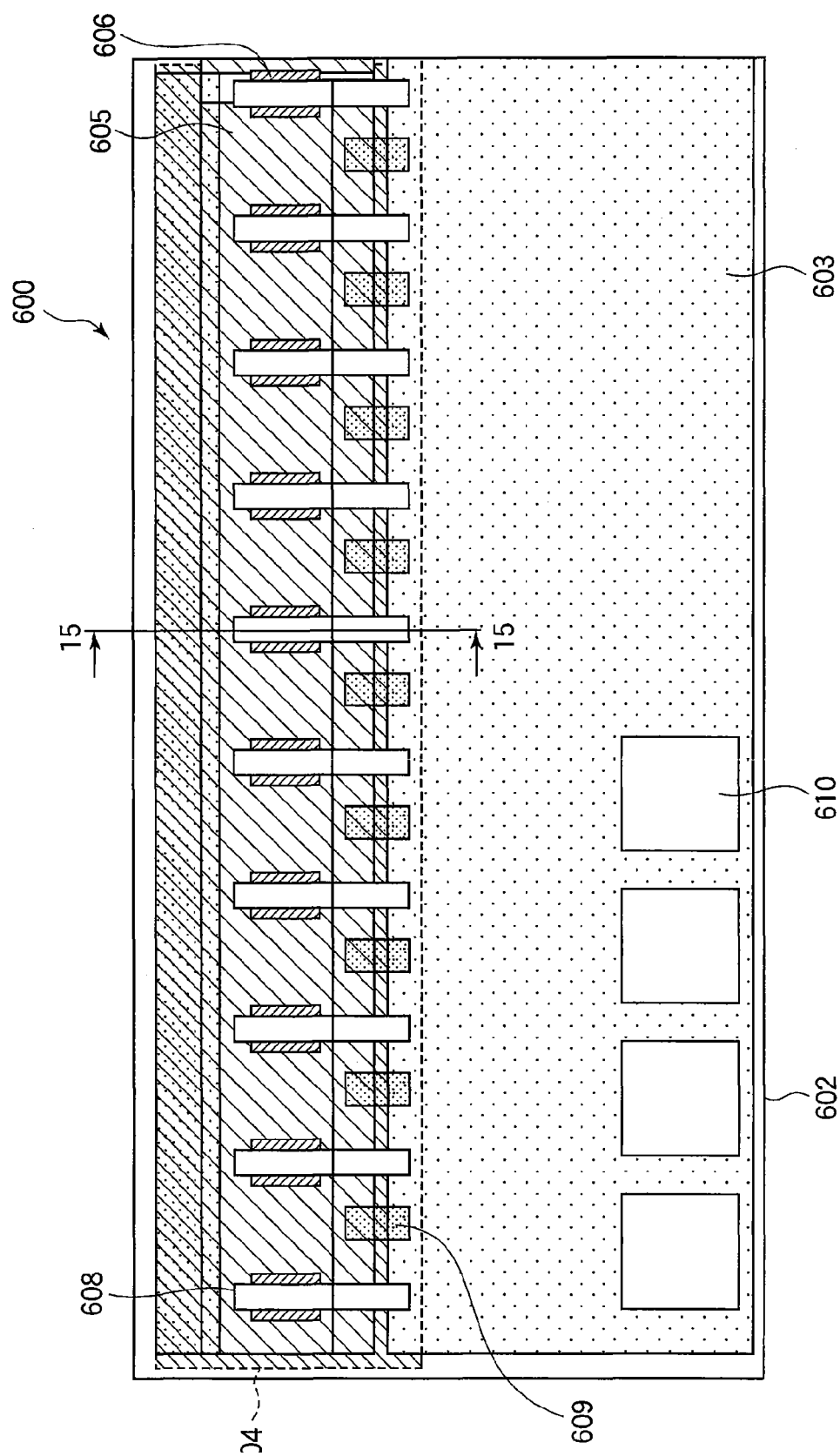
FIG. 14 is a plan view illustrating the structure of a composite semiconductor device according to the sixth embodiment.
Figure 15:
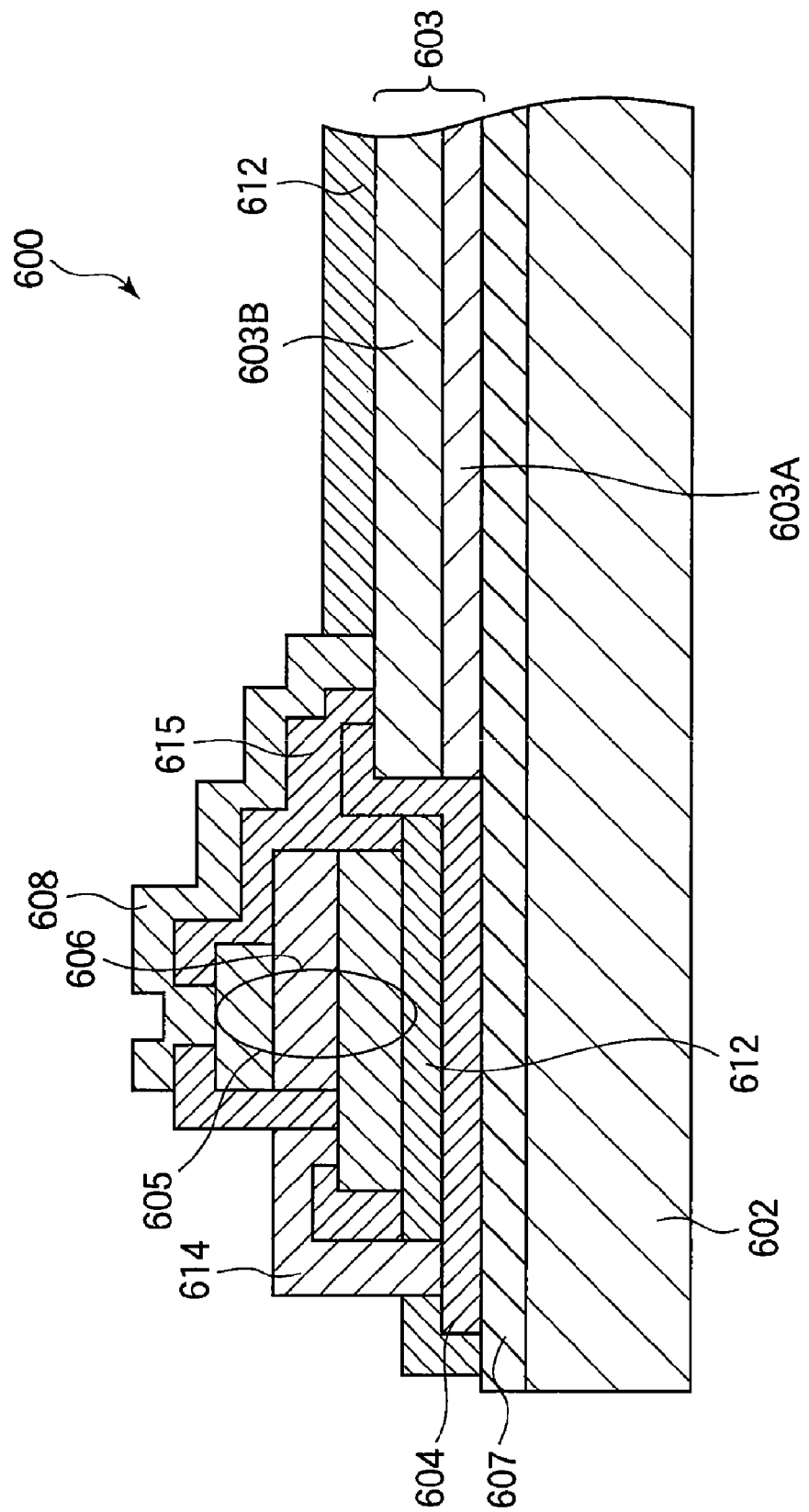
FIG. 15 is a sectional view illustrating the structure of the composite semiconductor device of FIG. 14, taken along line 15-15 in FIG. 14.

FIG. 14 is a sectional view showing the structure of the composite semiconductor device 600. FIG. 15 is a sectional view of the composite semiconductor device 600 taken along line 15-15 in FIG. 14.

The composite semiconductor device 600 of the sixth embodiment includes a third substrate 602, a semiconductor layer 603 having circuit elements for controlling the light-emission of light-emitting elements on the third substrate 602, a conductive layer 604 formed on the third substrate 602, a semiconductor thin-film 605 electrically connected to the conductive layer 604, a plurality of light-emitting regions 606 formed on the semiconductor thin-film 605, individual electrodes 608 for controlling the light-emission of the respective light-emitting regions 606, connection wirings 609 that form electrical contacts with other electrode contact layers on the surface of the semiconductor thin-film 605, connection pads 610 for input and output of the driving signal with the circuit region (i.e., the semiconductor layer 603), a passivation film 612, an conductive layer 614 electrically connecting the conductive layer 604 and the semiconductor layer 605, and an interlayer insulation film 615 that insulates the individual electrode 608 and the semiconductor thin-film 605 from each other.

The third substrate 602 is composed of glass, plastic, metal, ceramic, organic material or semiconductor material other than the semiconductor material used in the semiconductor thin-film 605 and the semiconductor layer 603 (i.e., the second semiconductor thin-film 603). The semiconductor thin-film 605 is formed on a substrate different from the third substrate 602, and is bonded onto the passivation film 612 on the third substrate 602. The semiconductor thin-film 605 has the same structure as the semiconductor thin-film 105 of the first embodiment, and is formed of compound semiconductor materials such as GaAs/AlGaAs based material or the like. The semiconductor layer (i.e., the second semiconductor thin-film) 603 has a semiconductor thin-film region 603A formed of, for example, GaAs or AlGaAs based compound semiconductor, GaN, InGaN or AlGaN based compound semiconductor, or the like. Further, the semiconductor thin-film region 603A of the second semiconductor thin-film 603 is composed of, for example, single-crystal Si or the like. It is also possible to appropriately use the semiconductor thin film 205 of the second embodiment, the semiconductor thin film 305 of the third embodiment, the semiconductor thin film 405 of the fourth embodiment, and the semiconductor thin film 505 of the fifth embodiment. The passivation film 612 is provided for bonding the semiconductor thin-film 605 onto the third substrate 602.

The semiconductor layer 603 includes a semiconductor thin-film region 603A having circuit elements (such as transistor, resistance, capacitor or the like) as in the case of the circuit region 103A of the first embodiment. The semiconductor layer 603 further includes a multilayer wiring region 603B formed on the semiconductor thin-film region 603A. The multilayer wiring region 603B includes wirings for connecting the respective circuit elements to each other, input/output wirings for input and output of electric power or signal, connection wirings connected to the input/output portions for electric power or signal. The semiconductor layer 603 contains, for example, single-crystal Si as chief material. Alternatively, the semiconductor layer 603 can be formed by layering single-crystal Si, poly-crystal Si, amorphous Si, organic semiconductor material, or the like. The semiconductor layer 603 can be formed of a plurality of thin-films of different materials, without layering.

In the sixth embodiment, the circuit region (i.e., the semiconductor thin-film region 603A and the wiring region 603B) is in the form of the semiconductor thin-film 603, and is bonded onto the third substrate 602. Therefore, in addition to the advantages of the first embodiment, there is an advantage that various kinds of substrate materials can be chosen.

Seventh Embodiment

A composite semiconductor device 700 according to the seventh embodiment of the present invention will be described. Regarding the components of the composite semiconductor device 700 that are the same as those of the composite semiconductor device 100 of the first embodiment, duplicate explanation will be omitted. The description will be made to the circuit region and the semiconductor thin-film different from those of the first embodiment.

In the first embodiment, the circuit region 103 is formed on a region different from the region where the semiconductor thin-film 105 (having the light-emitting region 106) is formed, and the circuit region 103 is formed on Si substrate or Si thin-film. In contrast, in the seventh embodiment, a circuit region 703 is formed in a thin-film semiconductor that contains any of amorphous Si, poly-Si or organic semiconductor material as chief material, or formed in a plurality of semiconductor materials chosen among amorphous Si, poly-Si or organic semiconductor material.

Figure 16:
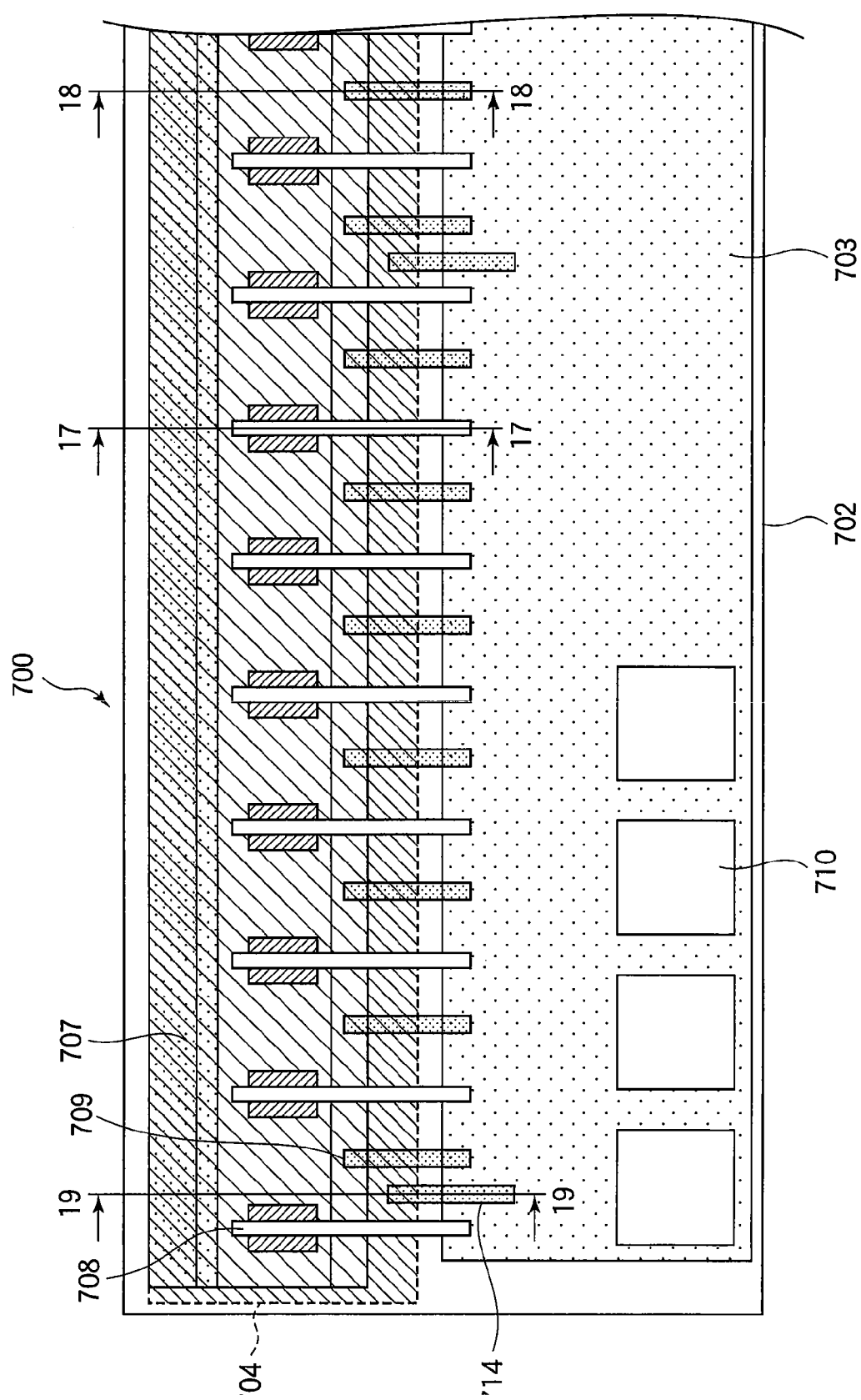
FIG. 16 is a plan view illustrating the structure of a composite semiconductor device according to the seventh embodiment.
Figure 17:
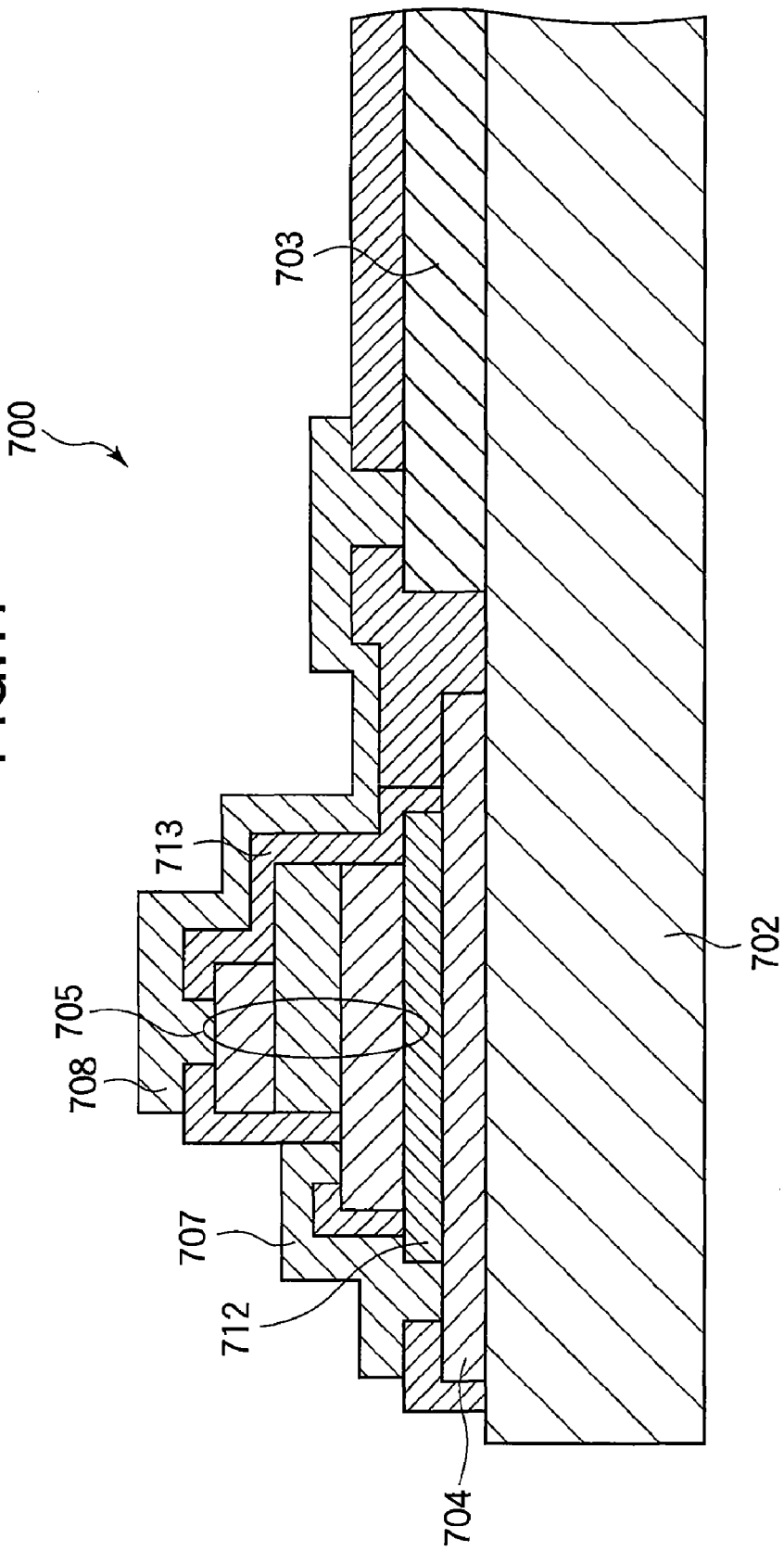
FIG. 17 is a sectional view illustrating the structure of the composite semiconductor device of FIG. 16, taken along line 17-17 in FIG. 16.
Figure 18:
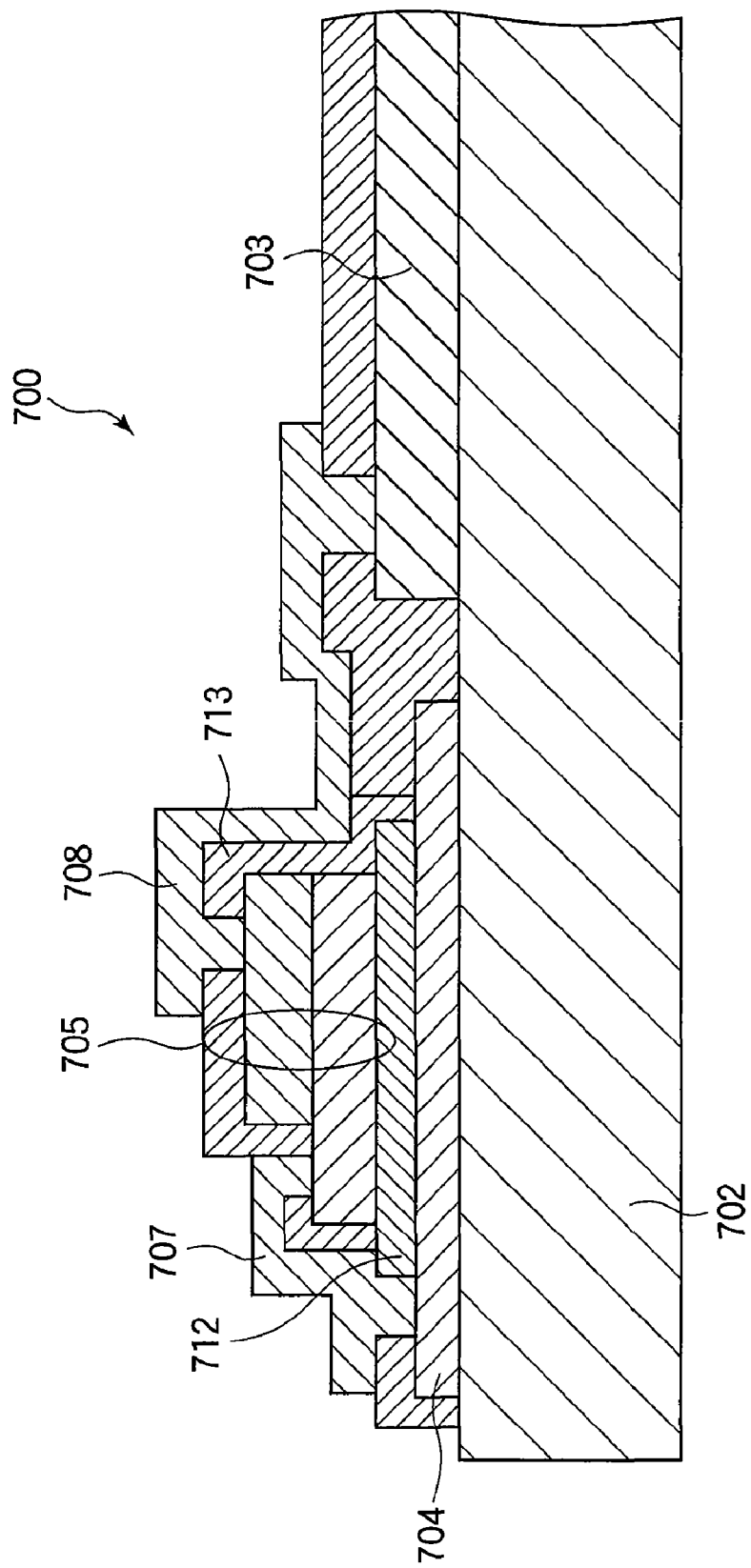
FIG. 18 is a sectional view illustrating the structure of the composite semiconductor device of FIG. 16, taken along line 18-18 in FIG. 16.
Figure 19:
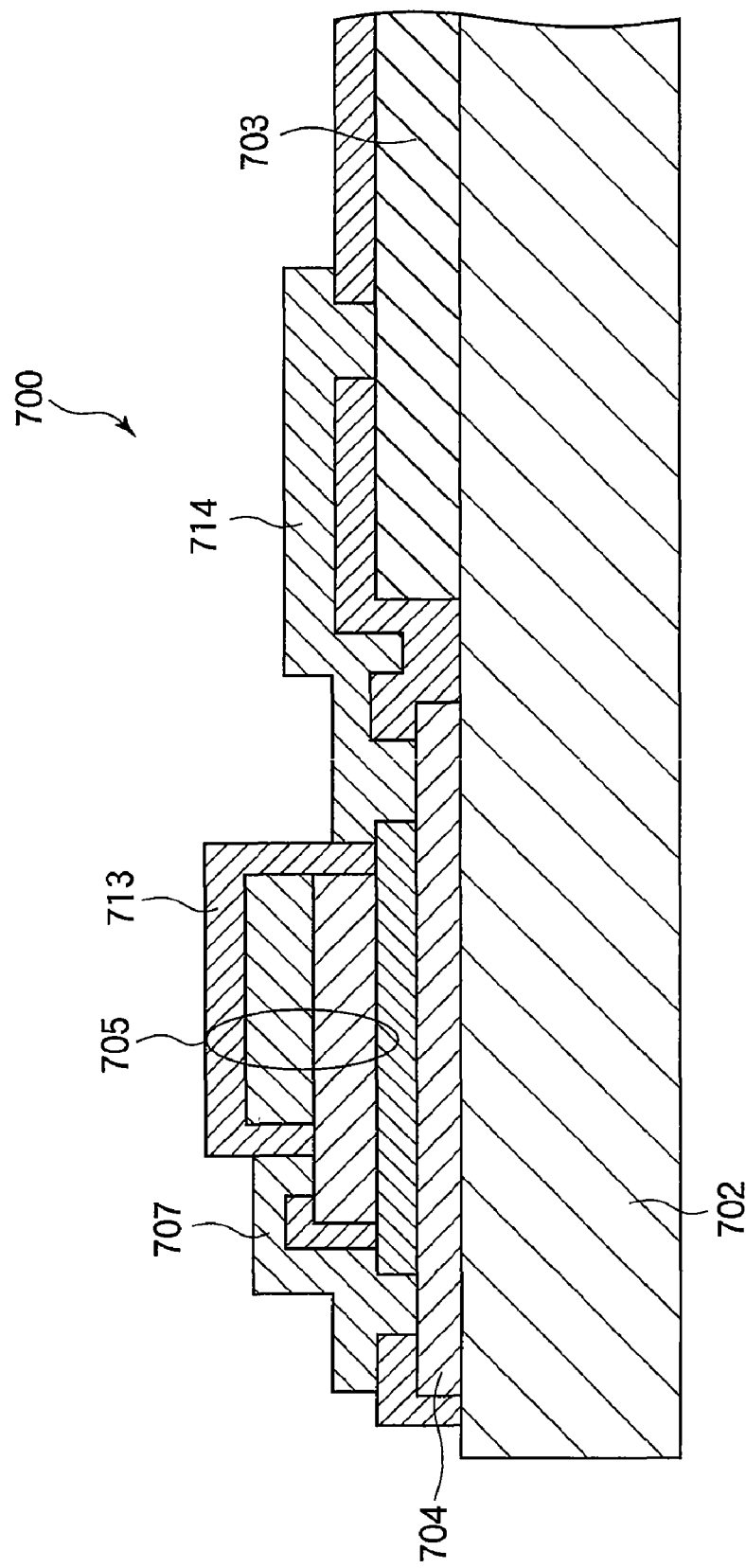
FIG. 19 is a sectional view illustrating the structure of the composite semiconductor device of FIG. 16, taken along line 19-19 in FIG. 16.

FIG. 16 is a plan view of the composite semiconductor device 700. FIGS. 17, 18 and 19 are sectional views of the composite semiconductor device 700 respectively taken along line 17-17, line 18-18 and line 19-19. The composite semiconductor device 700 includes a fourth substrate 702, a circuit region 703 (as a circuit element) for controlling the light-emission of light-emitting elements on the fourth substrate 702, a reflection layer 704 formed on the fourth substrate 702, a semiconductor thin-film 705, a plurality of light-emitting regions 706 formed on the semiconductor thin-film 705, a conductive layer 707 electrically connecting the reflection layer 704 and the semiconductor layer 705, individual electrodes 708 for controlling the light-emission of the respective light-emitting regions 706, connection wirings 709 that form electrical contacts with other electrode contact layers on the surface of the semiconductor thin-film 705, connection pads 710 for input and output of the driving signal with the circuit region 703, a passivation film 712, an interlayer insulation film 713 that insulates the reflection layer 704 and the individual electrodes 708 from each other, and individual electrodes 714 electrically connecting the circuit region 703 and the reflection layer 704.

The fourth substrate 702 is formed of, for example, glass, plastic, metal, ceramic or semiconductor material other than the semiconductor material used in the semiconductor thin-film 705.

The circuit region 703 contains, for example, thin-film semiconductor of single-crystal Si, poly-crystal Si, amorphous Si or organic semiconductor material as chief material. Alternatively, the circuit region 703 is formed of a plurality of materials chosen among the above materials.

The reflection layer 704 is, for example, a metal layer. The reflection layer 704 is composed of one of or any combination of Al, AlSiCu, NiAl, Ti, Cu, TiPtAu, AuGeNi, NiGe, Pd, CuAu, CrPd or NiPd, in the form of a single layer, laminated layers or an alloy layer. In a configuration in which the reflection layer 704 has no function as a conductive layer, and extra wirings are provided for supplying voltage to the conductive layer 707, the reflection layer 704 can be formed of other materials than metal. For example, the reflection layer 704 can be formed of a layered film of $Si/SiO_2$ or a layered film of $SiO_2/TiO_2$. Alternatively, the reflection layer 704 can be formed of a layered film of low refractive-index material/high refractive-index material. As the low refractive-index material, it is possible to use $SiO_2$, $CaF_2$, LiF, $MgF_2$ or the like. As the high refractive-index material, it is possible to use $TiO_2$, $CeO_2$, CdS, ZnS or the like. Further, the reflection layer 704 can be formed of a layered film of metal/semiconductor.

The semiconductor thin-film 705 is formed of, for example, the same materials as the first substrate. Further, if the fourth substrate 702 is formed of, for example, glass, it is possible to form the semiconductor thin-film on the glass substrate, and to transfer the semiconductor thin-film to the fourth substrate 702. Furthermore, it is also possible to form the conductive layer 704 on the fourth substrate 702, to form passivation film 712 on the conductive layer 704, and to bond the semiconductor thin-film 705 on the passivation film 712. The circuit region 703 is directly formed on the second substrate 702.

In the above configured composite semiconductor device 700, the circuit region 703 (formed on the region other than the semiconductor thin-film 705) contains, for example, poly-crystal Si, amorphous Si or organic semiconductor material as chief material, or is formed of a plurality of materials chosen from poly-crystal Si, amorphous Si or organic semiconductor material. Thus, in addition to the advantages of the first embodiment, there is an advantage that the circuit region 703 can be formed collectively, and therefore it becomes possible to reduce the labor of the manufacturing process.

Particularly, if a driving circuit is provided in the circuit region using poly-crystal Si, amorphous Si, organic material or like, it may be difficult to flow large current, or the variation of output may be large. However, in this embodiment, the semiconductor thin-film 705 has the thyristor structure, and therefore it is not necessary to provide the driving circuit on the circuit region 703 formed on the semiconductor thin-film 705. Accordingly, the whole structure of the composite semiconductor device 700 can be simplified.

Moreover, the same advantages can be obtained when the circuit region 703 has CMOS structure.

Eighth Embodiment

A composite semiconductor device 800 according to the eighth embodiment of the present invention will be described. The composite semiconductor device 800 of the eighth embodiment is formed by mounting any of the composite semiconductor devices 100, 200, 300, 400, 500, 600 and 700 according to the first, second, third, fourth, fifth, sixth and seventh embodiments to a substrate. In the eighth embodiment, the composite semiconductor device 800 will be described to include the composite semiconductor device 100 of the first embodiment mounted to the substrate, for convenience of description.

Figure 20:
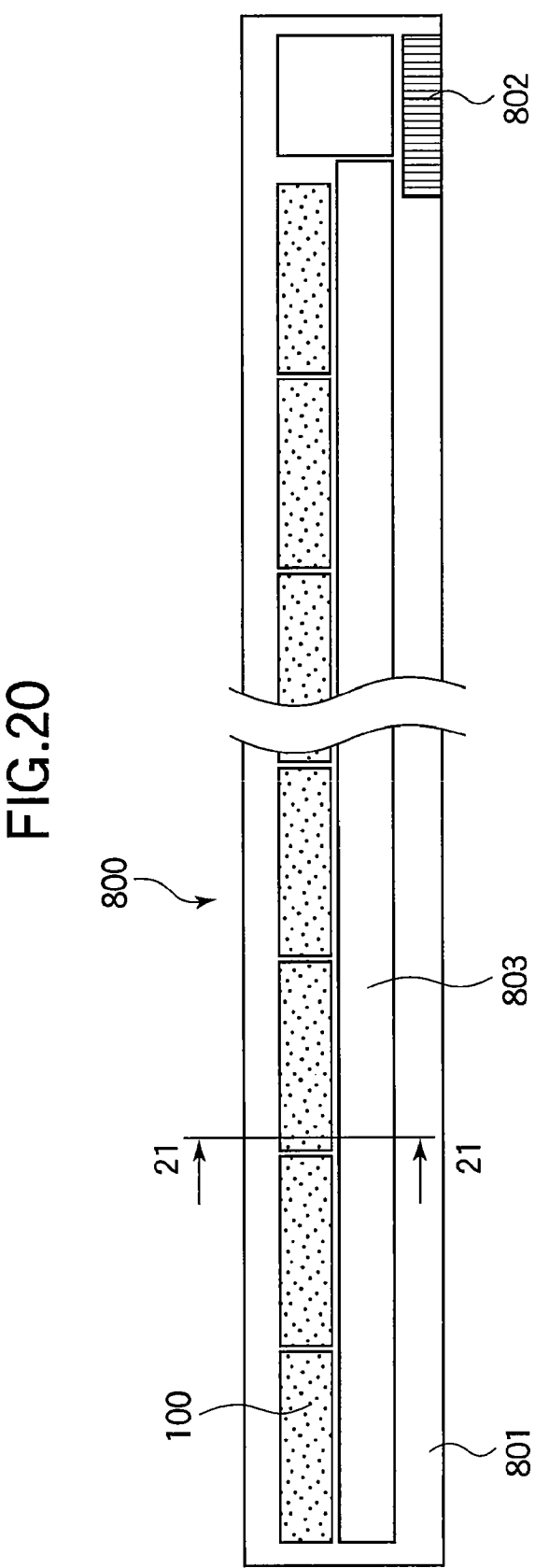
FIG. 20 is a plan view illustrating the structure of a composite semiconductor device according to the eighth embodiment.
Figure 21:
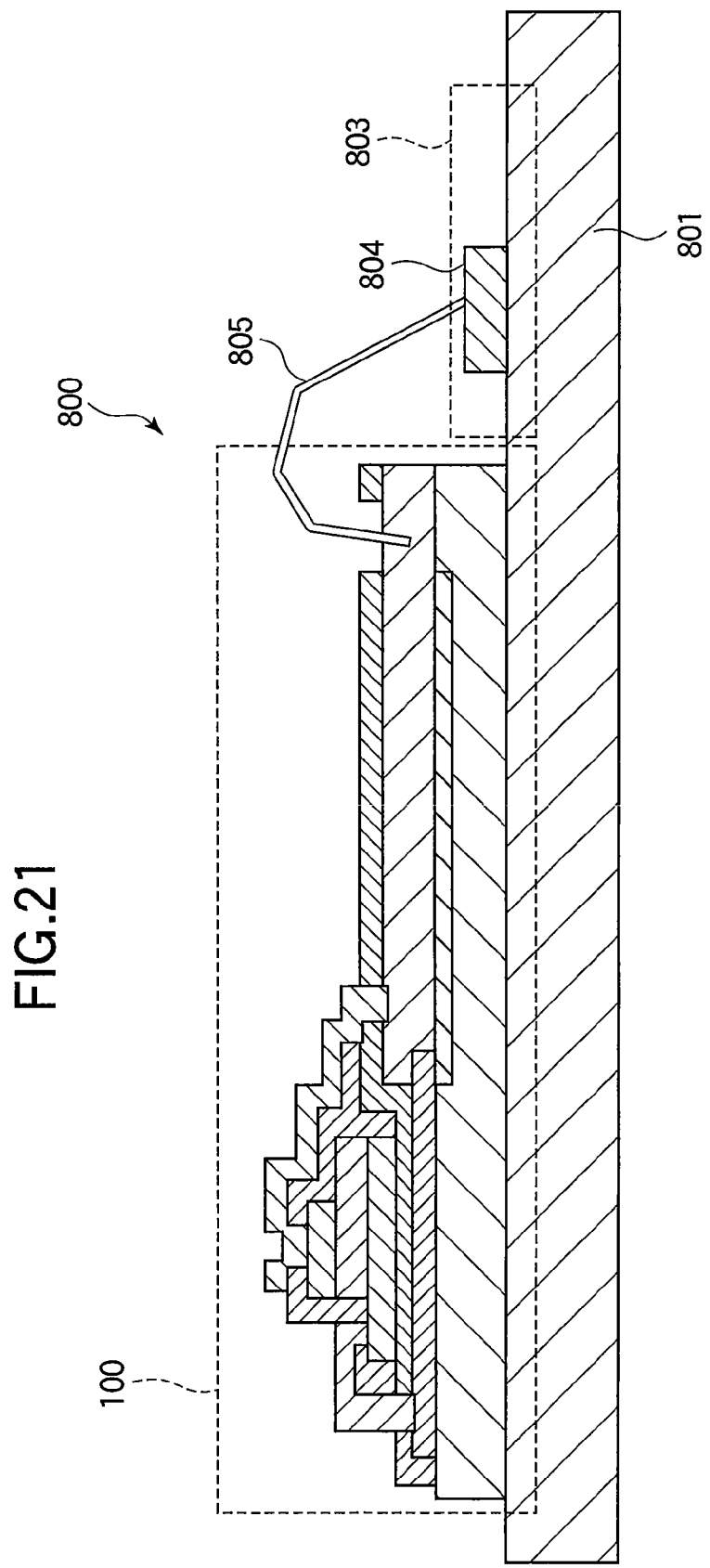
FIG. 21 is a sectional view illustrating the structure of the composite semiconductor device of FIG. 20, taken along line 21-21 in FIG. 20.

FIG. 20 is a plan view of the composite semiconductor device 800. FIG. 21 is a sectional view of the composite semiconductor device 800 taken along line 21-21 in FIG. 20. The composite semiconductor device 800 includes the composite semiconductor device 100 and a mounting substrate 801 to which the composite semiconductor device 100 is mounted, a connector region 802 for input and output of signal or electric power with external device, a wiring region 803 electrically connected to the connector region 802, connection pads 804 for processing the signal inputted via the connector region 802, and bonding wires 805 electrically connecting the connection pads 804 and the composite semiconductor device 100 to each other.

The mounting substrate 801 contains, for example, glass-epoxy, ceramic, plastic or metal as chief material. Further, the mounting substrate 801 can have a multilayer structure in which the wiring region 803 is provided. The connector region 802 is fixed to the mounting substrate 801, and electrically connected to the composite semiconductor device 100 via the wiring region 803 and the bonding wires 805. The connection pads 804 are disposed on the mounting substrate 801, and send the signal or the like (received at the connector region 802) to the composite semiconductor device 100. The bonding wires 805 electrically connect the composite semiconductor device 100 and the wiring region 803. One end of each bonding wire 805 is bonded to the composite semiconductor device 100, and the other end is connected to the connection pad 804.

With the above configured composite semiconductor device 800, there is an advantage that it becomes possible to control a lot more light-emitting elements, in addition to the advantages of the first to seventh embodiments.

Ninth Embodiment

A composite semiconductor device 900 of the ninth embodiment of the present invention will be described.

Figure 22:
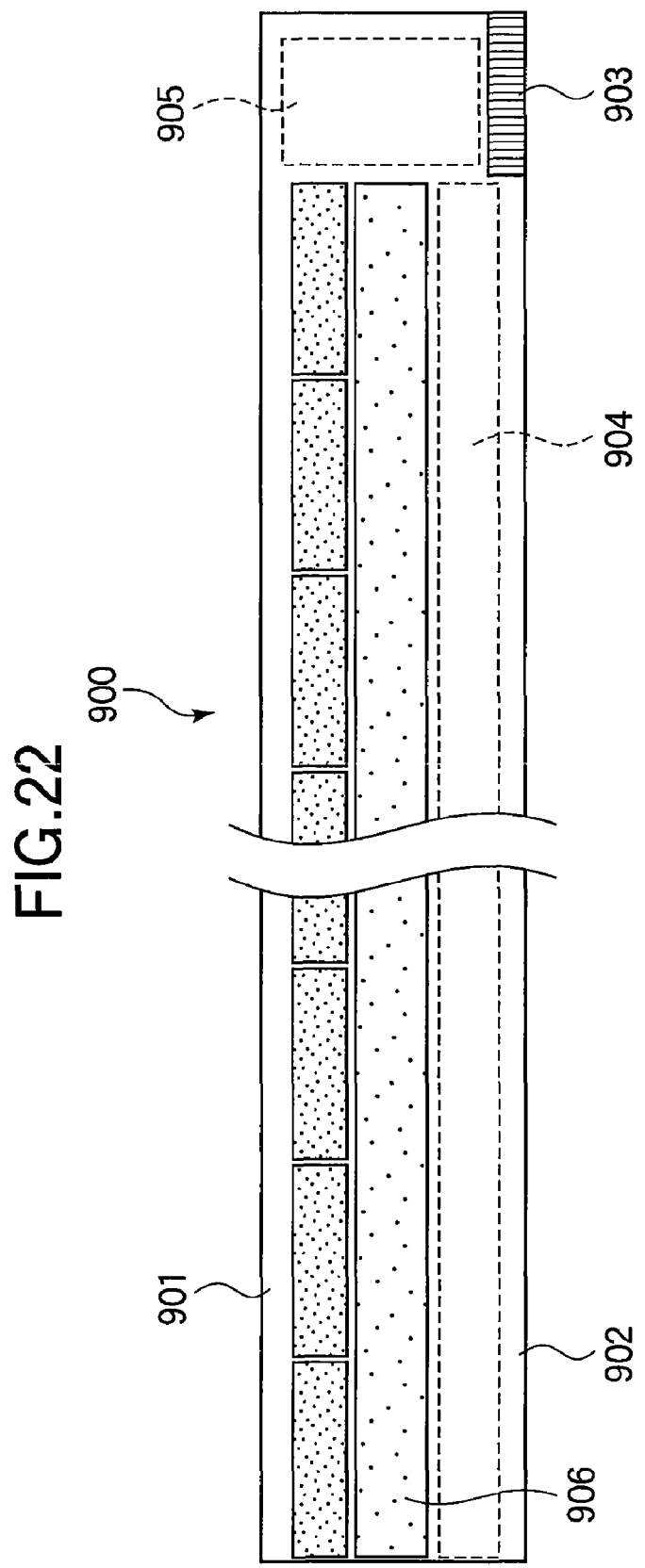
FIG. 22 is a plan view illustrating the structure of a composite semiconductor device according to the ninth embodiment.

FIG. 22 is a plan view of the composite semiconductor device 900. The composite semiconductor device 900 includes a composite semiconductor device 901, a mounting substrate 902 (as a first substrate) to which the composite semiconductor device 901 is mounted, a connector region 903 for input and output of signal or electric power with an external device, a wiring region 904 electrically connected to the connector region 903, an electronic-parts mounting region 905 formed on the mounting substrate 902, and a circuit region 906 (as a circuit element) for controlling the light-emission of the composite semiconductor device 901.

Figure 23:
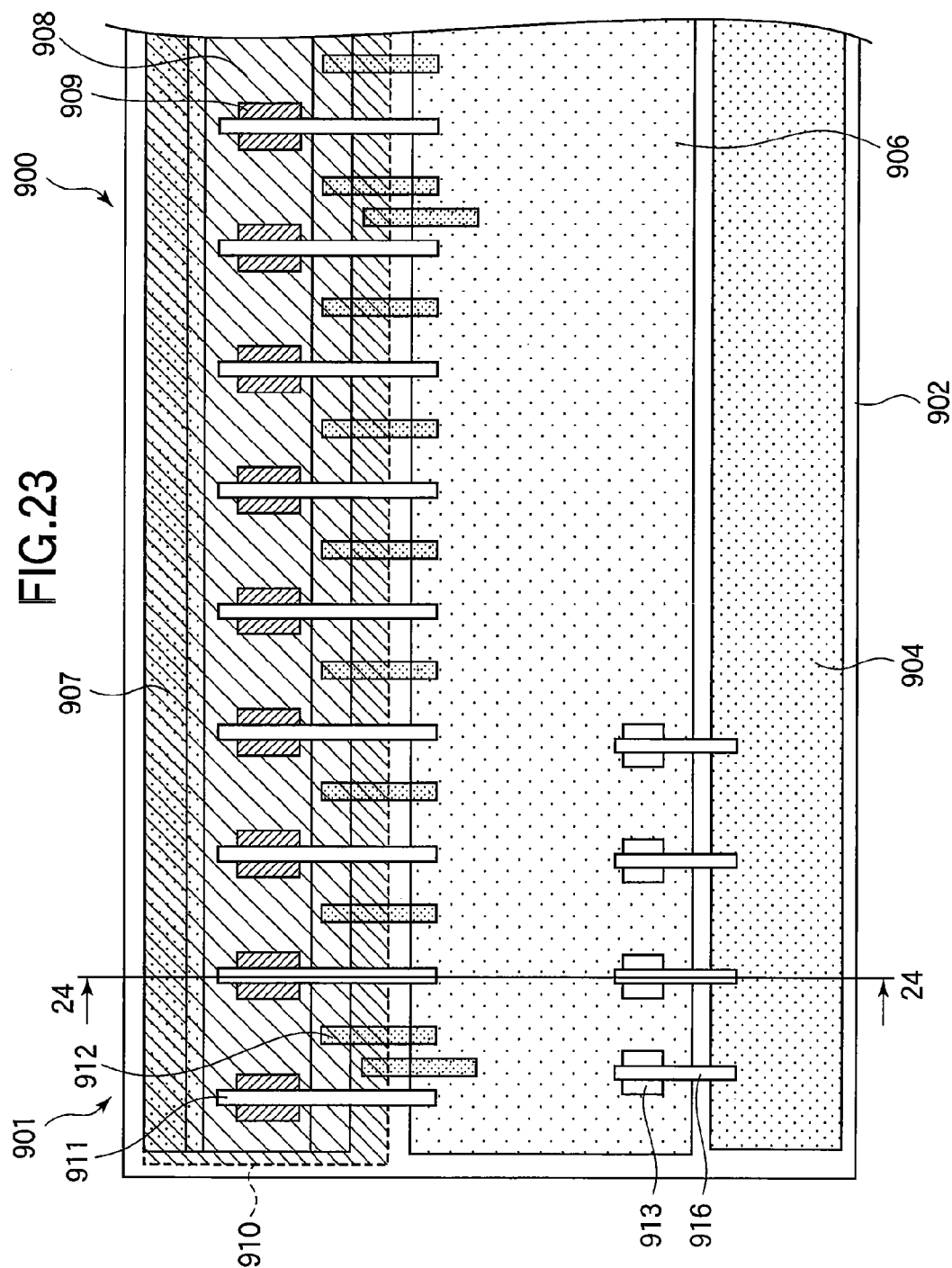
FIG. 23 is a plan view illustrating the arrangement of the composite semiconductor device of FIG. 22.
Figure 24:
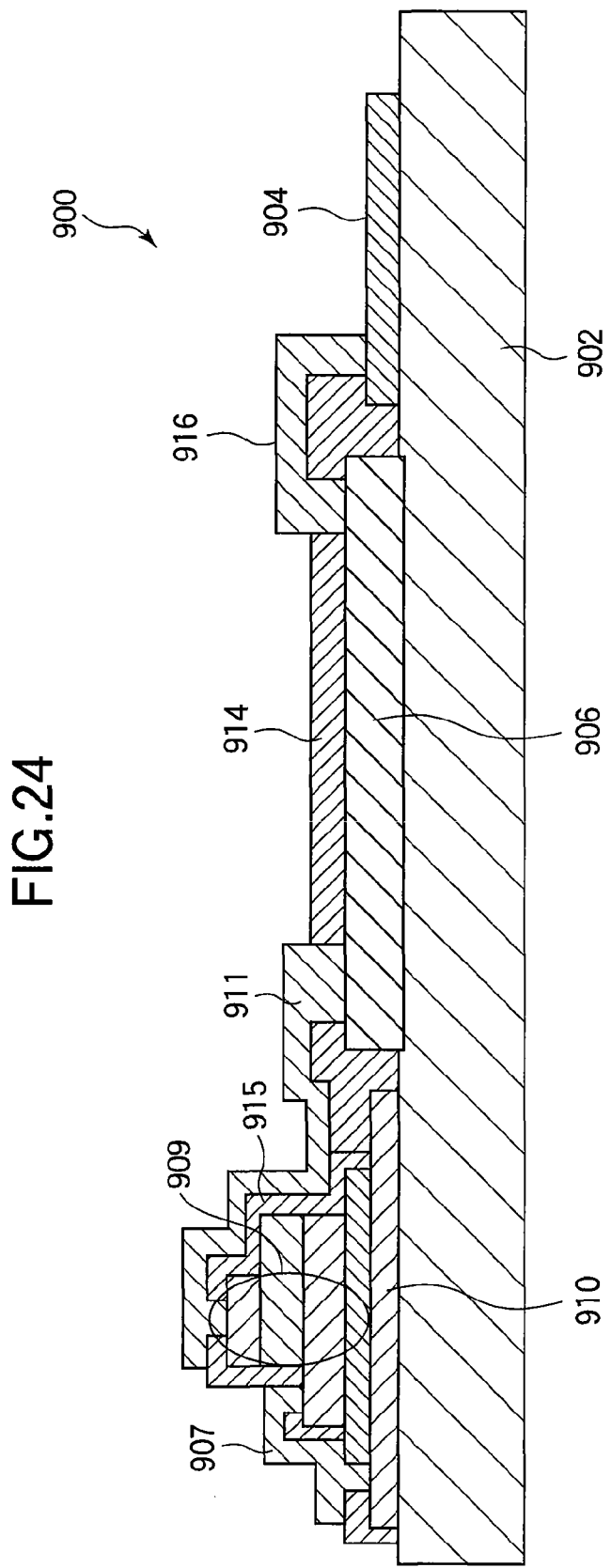
FIG. 24 is a sectional view illustrating the structure of the composite semiconductor device of FIG. 22, taken along line 24-24 in FIG. 22.

FIG. 23 is a plan view showing the positional arrangement of the composite semiconductor device 900. FIG. 24 is a sectional view taken along line 24-24 in FIG. 23.

In addition to the above described configuration, the composite semiconductor device 900 includes a conductive layer 907 formed on the mounting substrate 902, a semiconductor thin-film 908 electrically connected to the conductive layer 907, a plurality of light-emitting regions 909 formed on the semiconductor thin-film 908, a reflection layer 910 (having a function as a conductive layer) formed on the mounting substrate 902, individual electrodes 911 for controlling the light-emission of the respective light-emitting regions 909, connection wirings 912 that form electrical contacts with other electrode contact layers on the surface of the semiconductor thin-film 908, connection pads 913 for input and output of a predetermined driving signal with the circuit region 906, a passivation film 914, an interlayer insulation layer 915 having insulation property, and input/output connection wirings 916 electrically connecting the circuit region 906 and the wiring region 904 to each other.

Regarding the components of the composite semiconductor device 901 that are the same as those of the composite semiconductor devices 600 and 700 of the sixth and seventh embodiments, duplicate explanation will be omitted. The composite semiconductor device 100 of the first embodiment is formed by forming the circuit region 103, the conductive layer 104 and the reflection layer 107 or the like on the predetermined first substrate 102. In contrast, in this ninth embodiment, the composite semiconductor device 901 is formed by mounting the components on the mounting substrate 902.

The mounting substrate 902 is formed of, for example, glass, plastic, metal ceramic or semiconductor material other than the semiconductor material used in the semiconductor thin-film 908. The connector region 903 is fixed to the mounting substrate 902, and is electrically connected to the circuit region 906 via the electronic-parts mounting region 905 and the wiring region 904. The wiring region 904 electrically connects the connector region 903 and the circuit region 906 to each other. The electronic-parts mounting region 905 is a region on which electronic parts for controlling the composite semiconductor device 901 are mounted. The circuit region 906 is a region on which circuit elements for controlling the light-emission of the composite semiconductor device 901 are formed.

The components of the composite semiconductor device 901 have the same structure as those described in the first embodiment, and therefore duplicate explanation will be omitted.

The above configured composite semiconductor device 900 is so configured that the semiconductor thin-film 908, the wiring region 904 and the connector region 903 are disposed on the mounting substrate 902. Therefore, in addition to the advantages described in the sixth and seventh embodiment, there is an advantage that it becomes possible to eliminate the process of mounting the composite semiconductor device 900 on other mounting substrate.

Figure 25:
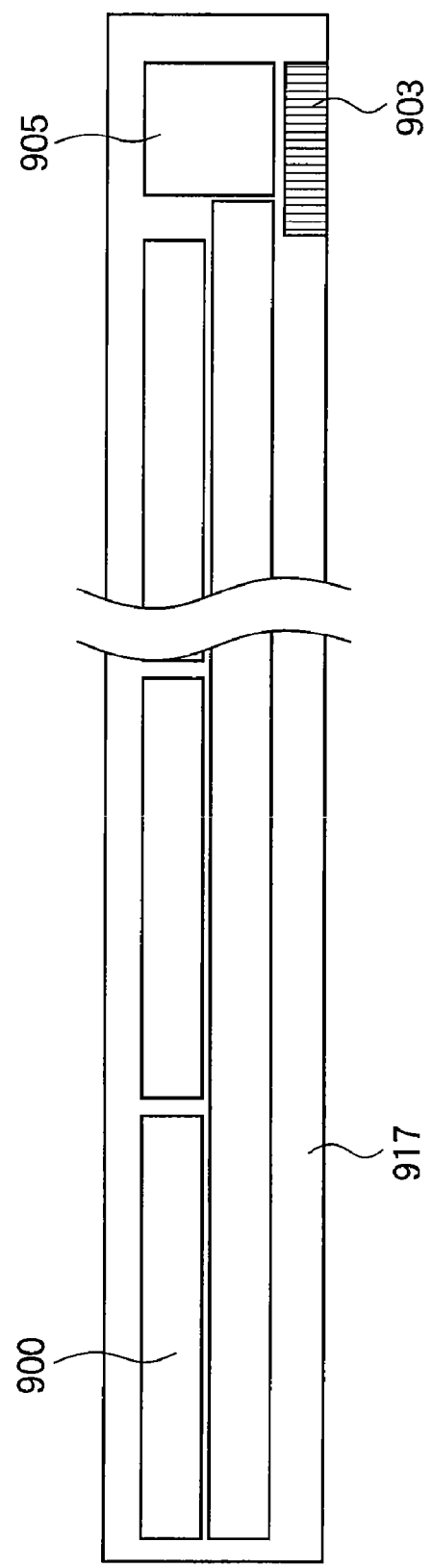
FIG. 25 is a plan view illustrating the structure of a composite semiconductor device according to the tenth embodiment.

Further, as shown in FIG. 25, it is possible to dispose the composite semiconductor device 900 on a mounting substrate 917 to thereby form a multilayer wiring structure. In this case, the connector region 903 and the electronic-parts mounting region 905 are formed on the mounting substrate 917.

Tenth Embodiment

A composite semiconductor device according to the tenth embodiment of the present invention will be described.

Figure 26:
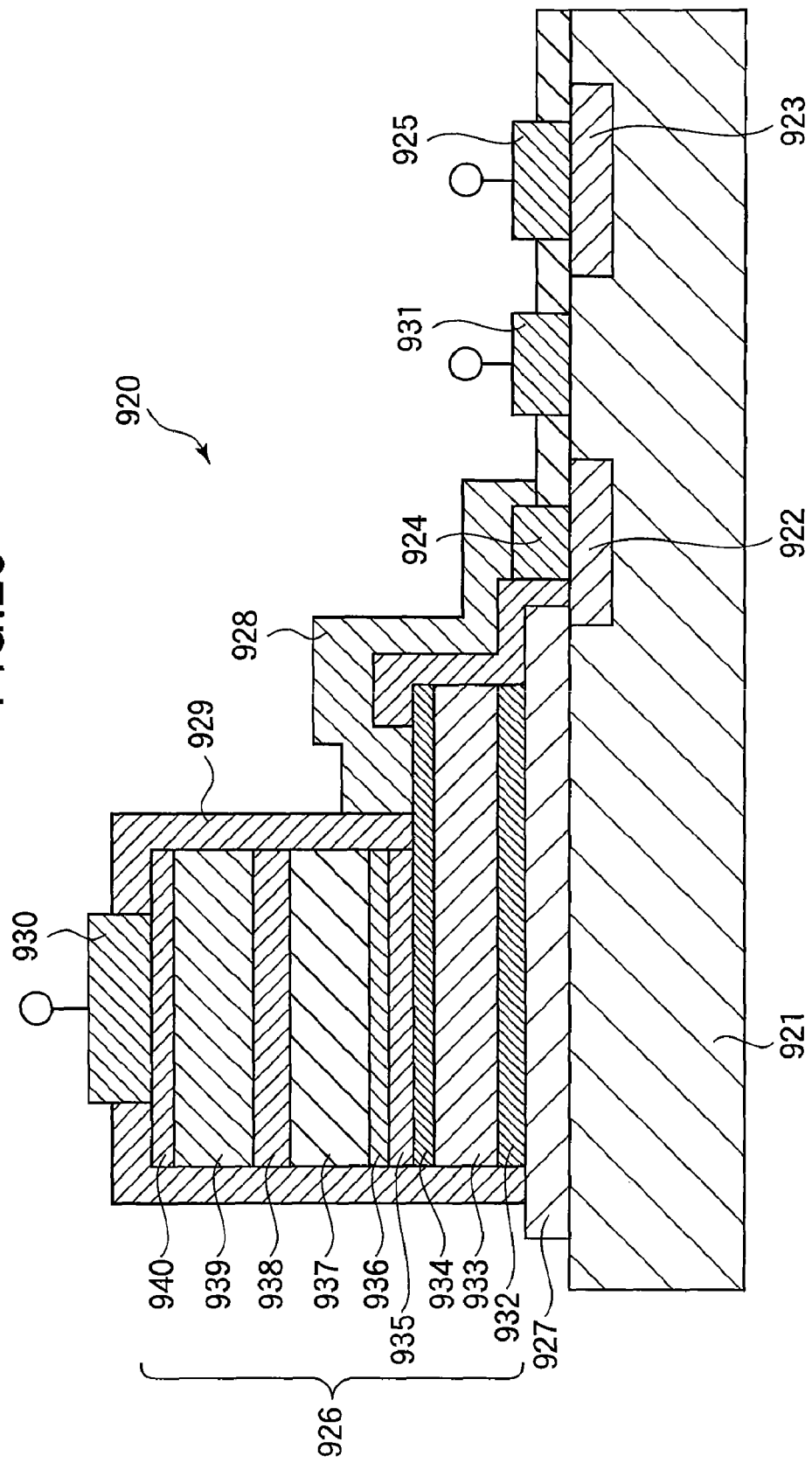
FIG. 26 is a sectional view illustrating the structure of the composite semiconductor device of FIG. 25, taken along line 26-26 in FIG. 25.

FIG. 26 is a sectional view of the composite semiconductor device. The composite semiconductor device 920 of the tenth embodiment includes a sixth substrate 921 of the second conductivity type having a circuit region (formed of, for example, single-crystal Si, poly-crystal Si or organic material), a source layer 922 of the first conductivity type, a drain layer 923 of the first conductivity type, a conductive layer 924 formed on the source layer 922, an anode electrode 925 formed on the drain layer 923, a semiconductor thin-film 926, an interlayer insulation layer 927 that insulates the sixth substrate 921 and the semiconductor thin-film 926 from each other, connection wirings 928 that electrically connect the conductive layer 924 and the semiconductor thin-film 926 to each other, a passivation film 929, a cathode electrode 930 of the second conductivity type, and a gate electrode 931 of the second conductivity type.

Although the detailed description is omitted, the composite semiconductor device 920 is configured to form a CMOS structure using the source layer 922 and the drain layer 923, and form a thyristor structure using the anode electrode 925, the cathode electrode 930 and the gate electrode 931.

The semiconductor thin-film 926 includes a bonding layer 932 of the first conductivity type (formed of, for example, GaAs), a conductive layer 933 of the first conductivity type (formed of, for example, $Al_sGa_{1-s}As$), a contact layer 934 of the first conductivity type (formed of, for example, GaAs), an etching stopper layer 935 of the first conductivity type (formed of, for example, InGaP), a separation layer 936 of the first conductivity type (formed of, for example, GaAs), a lower cladding layer 937 of the first conductivity type (formed of, for example, $Al_xGa_{1-x}As$), an active layer 938 of the first conductivity type (formed of, for example, $Al_yGa_{1-y}As$), an upper cladding layer 938 of the second conductivity type (formed of, for example, $Al_zGa_{1-z}As$), and a contact layer 940 of the second conductivity type (formed of, for example, GaAs).

In this regard, it is preferable that composition of the respective semiconductor layers satisfy the following relationships:

$1 \geq x \geq 0$;

$1 \geq z > y \geq 0$, and $s > y$.

Since the composite semiconductor device 920 is configured as above, the pn-junction can be formed in the semiconductor thin-film 926 and the composite semiconductor device 920 forms the thyristor structure as a whole. Therefore, the structure of the semiconductor thin-film can be simplified, and the cost can be reduced.

It is also possible to form contacts on the backside of the contact layer 934 without forming the bonding layer 932 and the conductive layer 933. In this case, the etching stopper layer 935 and the separation layer 936 can be omitted. Therefore, the cost of the semiconductor thin-film 926 can be further reduced.

Eleventh Embodiment

A composite semiconductor device according to the eleventh embodiment of the present invention will be described.

Figure 27:
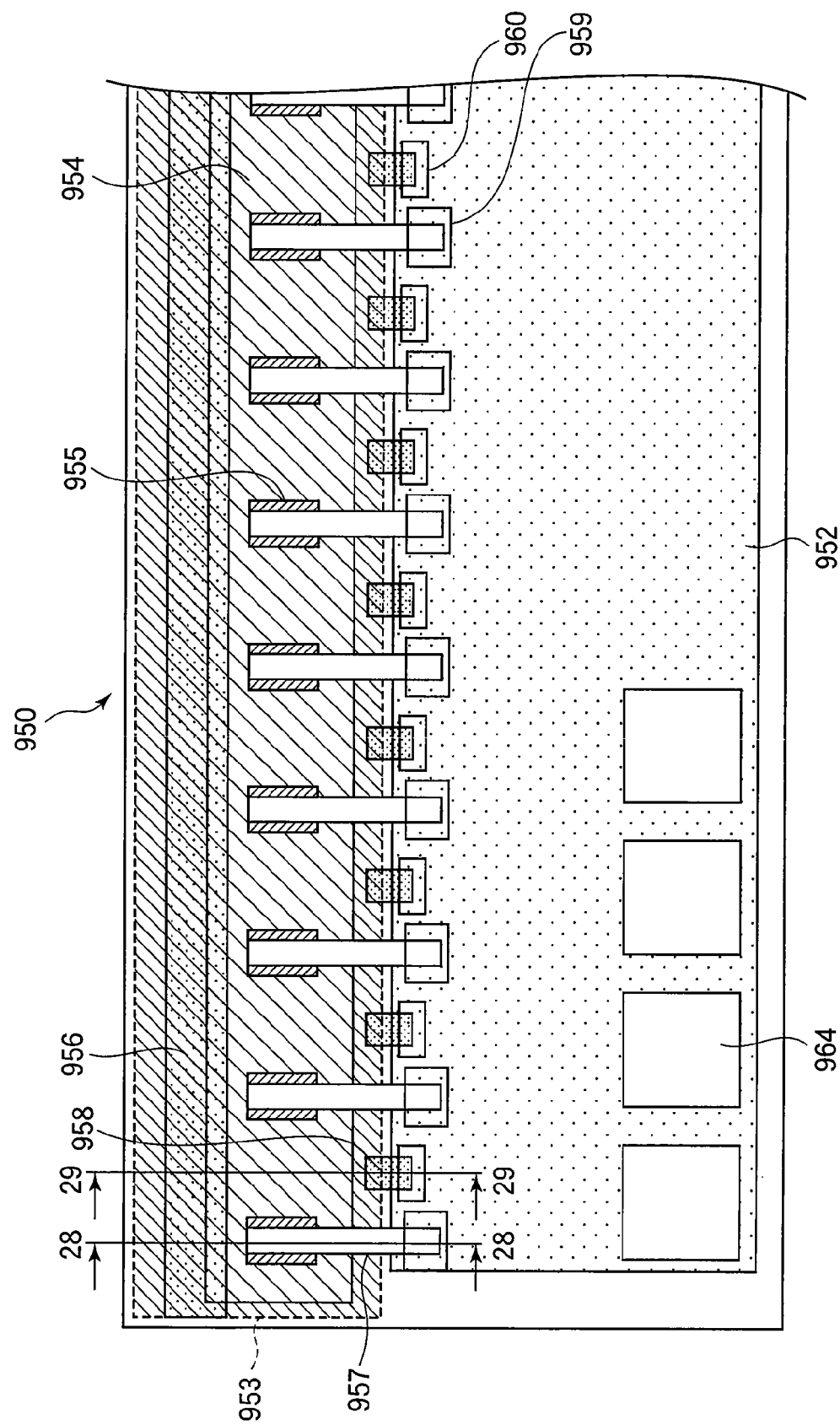
FIG. 27 is a plan view illustrating the structure of a composite semiconductor device according to the eleventh embodiment.
Figure 28:
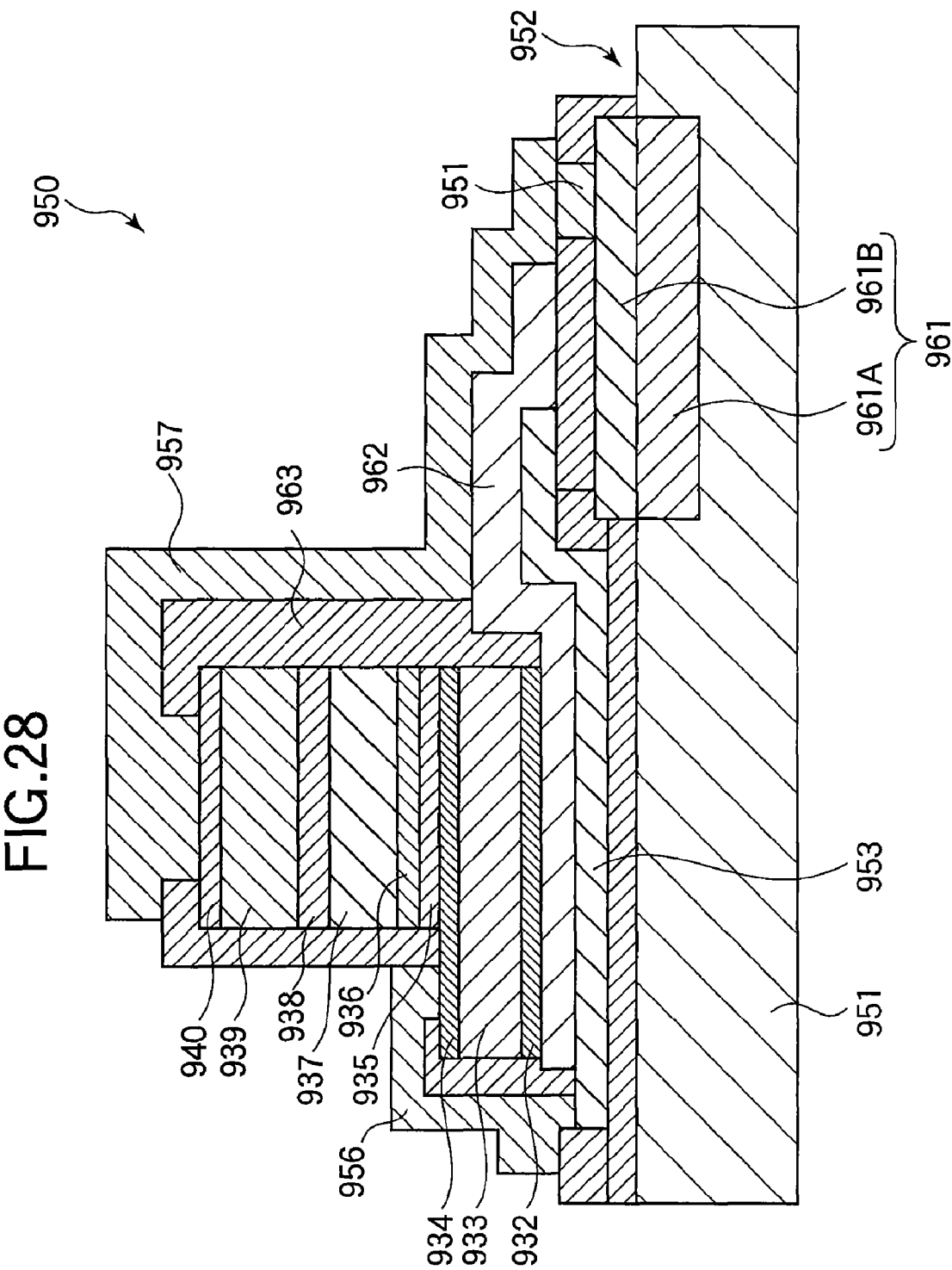
FIG. 28 is a sectional view illustrating the structure of the composite semiconductor device of FIG. 27, taken along line 28-28 in FIG. 27.
Figure 29:
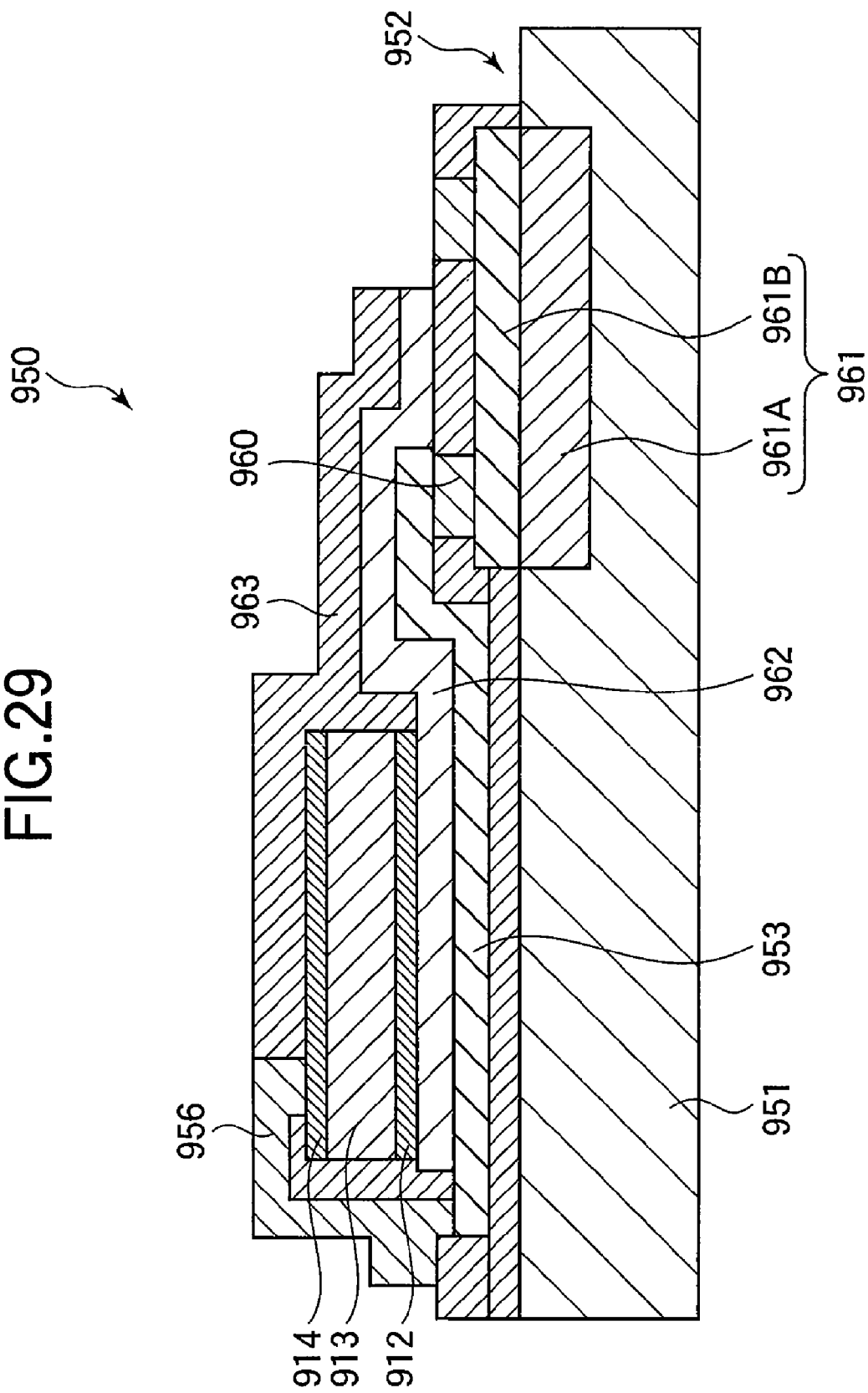
FIG. 29 is a sectional view illustrating the structure of the composite semiconductor device of FIG. 27, taken along line 29-29 in FIG. 27.

FIG. 27 is a plan view of the composite semiconductor device 950, and FIGS. 28 and 29 are sectional views respectively taken along line 28-28 and line 29-29 in FIG. 27. The composite semiconductor device 950 includes a sixth substrate 951 of the second conductivity type (formed of, for example, single-crystal Si, poly-crystal Si, amorphous Si or organic material), a circuit region 952 formed on the sixth substrate 951, a conductive layer 953 formed on the sixth substrate 951, a semiconductor thin-film 954 formed on the conductive layer 953, light-emitting regions 955 formed on the semiconductor thin-film 954, a conductive layer 956 electrically connecting the conductive layer 953 and the semiconductor thin-film 954 to each other, the individual electrodes 957 electrically connecting the semiconductor thin-film 954 and the circuit region 952 to each other, wiring regions 958 electrically connecting the conductive layer 953 and the circuit region 952 to each other, connection pads 959 electrically connecting individual electrodes 957 and the circuit region 952 to each other, connection pads 960 electrically connecting the conductive layer 956 and the circuit region 952 to each other, integrated circuits 961A and 961B (i.e., a circuit element region 961A and a multilayer wiring region 961B) for driving the light-emitting regions 955, an interlayer insulation layer 962 having insulation property, a passivation film 962, and connection pads 964. The structure of the semiconductor thin-film 954 is the same as the semiconductor thin-film 926 of the tenth embodiment, and therefore duplicate explanation will be omitted.

The integrated circuits 961 (i.e., the circuit element region 961A and the multilayer wiring region 961B) can have "pnpn" thyristor structure, or can have "pnp" or "npn" transistor structure. The integrated circuit 961 can have a CMOS integrated circuit, in addition to the thyristor structure or the transistor structure. Further, the integrated circuit 961 can be the CMOS integrated circuit.

The above configured composite semiconductor device 950 is configured to form the thyristor structure as a whole, and therefore the structure of the semiconductor thin-film 954 cam be simplified.

Moreover, as in the tenth embodiment, it is also possible to form contacts on the backside of the contact layer 934, without forming the bonding layer 932 and the conductive layer 933. In this case, the etching stopper layer 935 and the separation layer 936 can also be omitted. With such a structure, the cost of the semiconductor thin-film can be further reduced.

Twelfth Embodiment

The twelfth embodiment of the present invention will be described.

Figure 30:
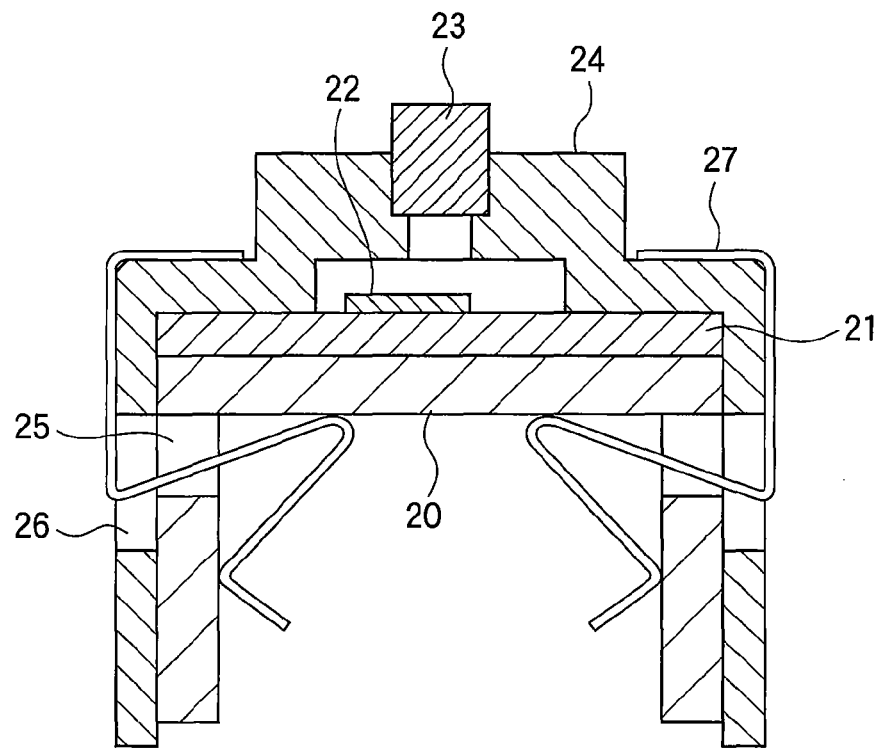
FIG. 30 is an elevation view illustrating the structure of a print head according to the eleventh embodiment.

FIG. 30 shows a print head according to the twelfth embodiment. The print head of the twelfth embodiment is used as an exposing device in an electrophotographic printer, copier or the like. To be more specific, as shown in FIG. 30, the print head includes a light-emitting unit 21 (having a light-emitting thyristor element) supported on a predetermined base member 20. The light-emitting unit 21 is constructed by mounting the composite semiconductor device of any of the first to seventh embodiments and tenth embodiment on the mounting substrate. The light-emitting unit 21 includes linearly arranged light-emitting portions 22 and a rod lens array 23 (i.e., an optical element that focuses the light emitted by the light-emitting portions 22) disposed above the light-emitting portions 22. The rod lens array 23 includes a lot of columnar optical lenses whose optical axes are aligned with the light-emitting portions 22 of the light-emitting unit 21. The rod lens array 23 is supported at a predetermined position by a lens holder 24 as an optical element holder. The light-emitting portions 22 of the light-emitting unit 21 can be any of the semiconductor thin-film 105, 205, 305, 405, 505, 605, 705, 908 and 954.

The lens holder 24 is so formed as to cover the base member 20 and the light-emitting unit 21. The base member 20, the light-emitting unit 21 and the lens holder 24 are held by dampers 27 and are fixed with respect to each other. The dampers 27 are inserted through openings 25 formed on the base member 20 and openings 26 formed on the lens holder 24. In other words, the base member 20 and the lens holder 24 constitute a support frame supporting the light-emitting unit 21 (i.e., the composite semiconductor device) and the rod lens array 23.

In the above configured print head, the light emitted by the light-emitting unit 21 is focused by the rod lens array 23, and is incident on a predetermined external member.

As described above, in the twelfth embodiment of the present invention, the composite semiconductor device of any of the first to seventh embodiments and tenth embodiment is used as the light-emitting unit 21. Therefore, the print head can be miniaturized, and the quality of the image can be enhanced. Further, according to the print head of this embodiment, functions required of driving circuits for the light-emitting elements can be divided, and therefore the cost can be partially reduced according to the specification of the driving circuits. Therefore, the cost of the print head can be reduced, and the performance of the print head can be enhanced.

Thirteenth Embodiment

A print head of the thirteenth embodiment of the present invention, to which the composite semiconductor device of the ninth embodiment is applied, will be described.

Figure 31:
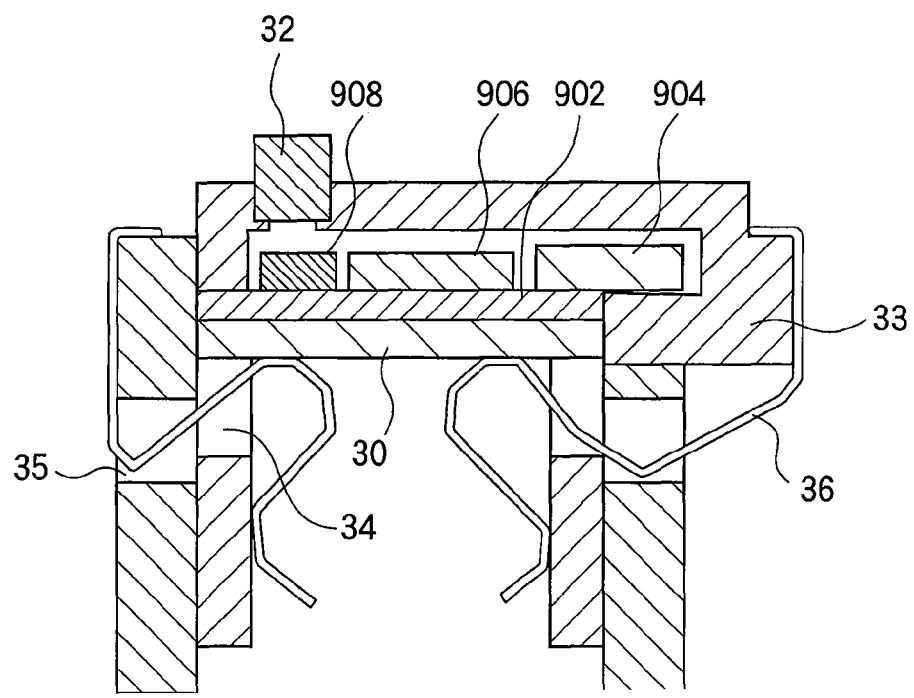
FIG. 31 is an elevation view illustrating the structure of a print head according to the twelfth embodiment.

FIG. 31 shows a print head according to the thirteenth embodiment. The print head of the thirteenth embodiment is used as an exposing device of an electrophotographic printer, copier or the like. To be more specific, as shown in FIG. 31, the print head includes the composite semiconductor device 900 (having a light-emitting thyristor element) supported on a predetermined base member 30. The composite semiconductor device 900 of the ninth embodiment has the mounting substrate 902 (as a first substrate) fixed onto the predetermined base member 30. A rod lens array 32 (i.e., an optical element that focuses the light emitted by the light-emitting portions) is disposed above light-emitting portions of the semiconductor thin-film 908 of the composite semiconductor device 900. The rod lens array 32 includes a lot of columnar optical lenses whose optical axes are aligned with the light-emitting portions of the semiconductor thin-film 908, and is supported at a predetermined position by a lens holder 33 as an optical element holder, as is the case with the rod lens array 23 of the twelfth embodiment.

The lens holder 33 is so formed as to cover the base member 30 and the composite semiconductor device 900. The base member 30, the composite semiconductor device 900 and the lens holder 33 are held by dampers 36 and are fixed with respect to each other. The dampers 36 are inserted through openings 34 formed on the base member 30 and openings 35 formed on the lens holder 33. In other words, the base member 30 and the lens holder 33 constitute a support frame that supports the semiconductor thin-film 908 (i.e., the composite semiconductor device) and the rod lens array 32.

The above configured print head of the thirteenth embodiment of the present invention employs the composite semiconductor device 900 of the ninth embodiment, and therefore the reliability of the wiring region can be drastically enhanced.

Fourteenth Embodiment

A print head of the fourteenth embodiment of the present invention will be described. In the print head of the fourteenth embodiment, the print head of the thirteenth embodiment is modified to use an optical lens.

Figure 32:
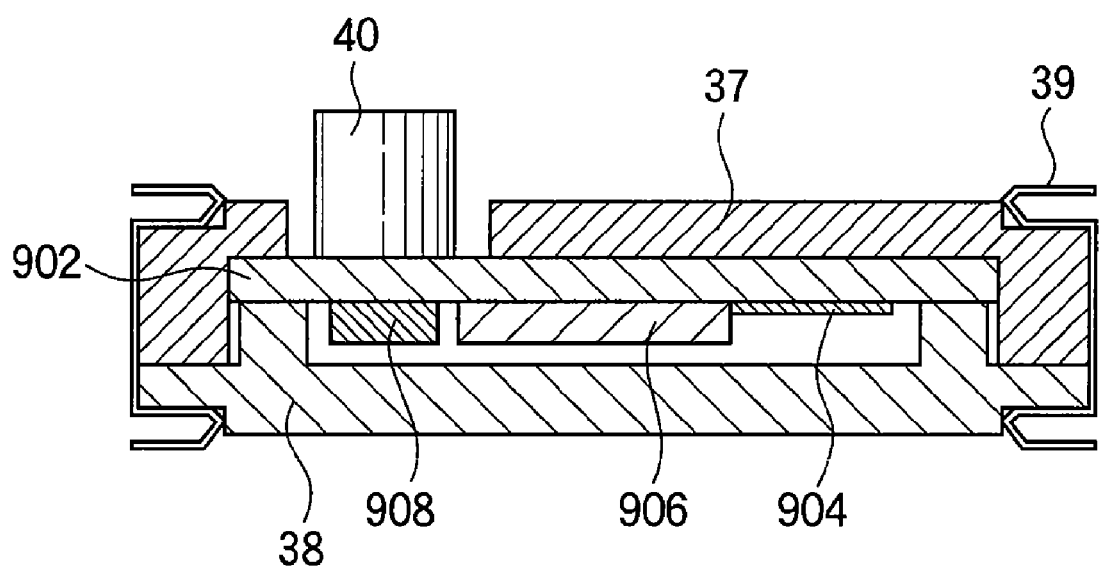
FIG. 32 is an elevation view illustrating the structure of a print head according to the thirteen embodiment.

FIG. 32 shows a print head according to the fourteenth embodiment. The print head of the fourteenth embodiment is used as an exposing device of an electrophotographic printer, copier or the like. To be more specific, as shown in FIG. 32, the print head includes the composite semiconductor device 900 (having a light-emitting thyristor element) supported on predetermined support frames 37 and 38. The composite semiconductor device 900 has the mounting substrate 902 (as a first substrate) fixed to the support frames 37 and 38, and the support frames 37 and 38 are fixed to each other by means of pins 39. An optical lens 40 is mounted to the mounting substrate 902, so that the composite semiconductor device 900 with the optical lens 40 mounted thereto is obtained.

In the print head of the fourteenth embodiment of the present invention, the composite semiconductor device 900 has the optical lens 40, and therefore it is not necessary to provide a lens holder or the like for holding the rod lens array (described in the eleventh embodiment). Therefore, the assembling of the print head becomes easy, and the structure of the print head can be small and simple in structure. Although not shown in FIG. 32, according to the print head of this embodiment, it is also possible to appropriately provide heat radiation fins on the support frames 37 and 38. Further, according to the print head of the fourteenth embodiment, a control circuit for compensating the light powers from the print head using light-power compensation data to uniform the light powers from the print head, a memory storing the light-power compensation data, a power source needed for the respective light-emitting elements to emit the light, or the like can be disposed outside the print head (for example, in an image forming apparatus to which the print head is mounted).

Fifteenth Embodiment

The fifteenth embodiment of the present invention will be described. The print heads according to the twelfth to fourteenth embodiments are employable as a print head of an image forming apparatus according to the fifteenth embodiment.

The image forming apparatus according to the fifteenth embodiment is configured to form an image by causing the toner to adhere to a predetermined recording medium, and is applicable to an electrophotographic printer or copier of transfer-type.

Figure 33:
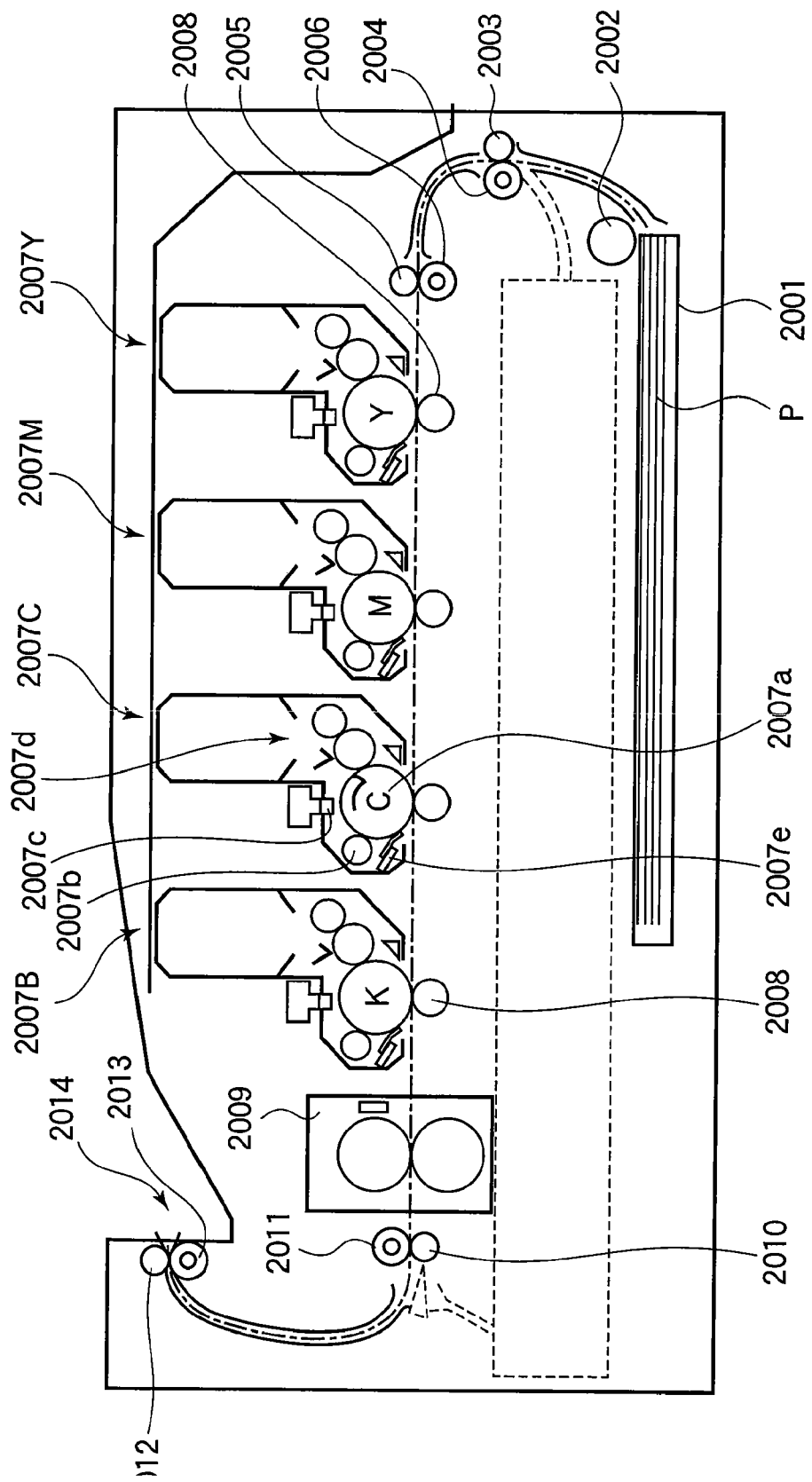
FIG. 33 is a sectional view illustrating the structure of an image forming apparatus according to the fourteenth embodiment.
Figure 34:
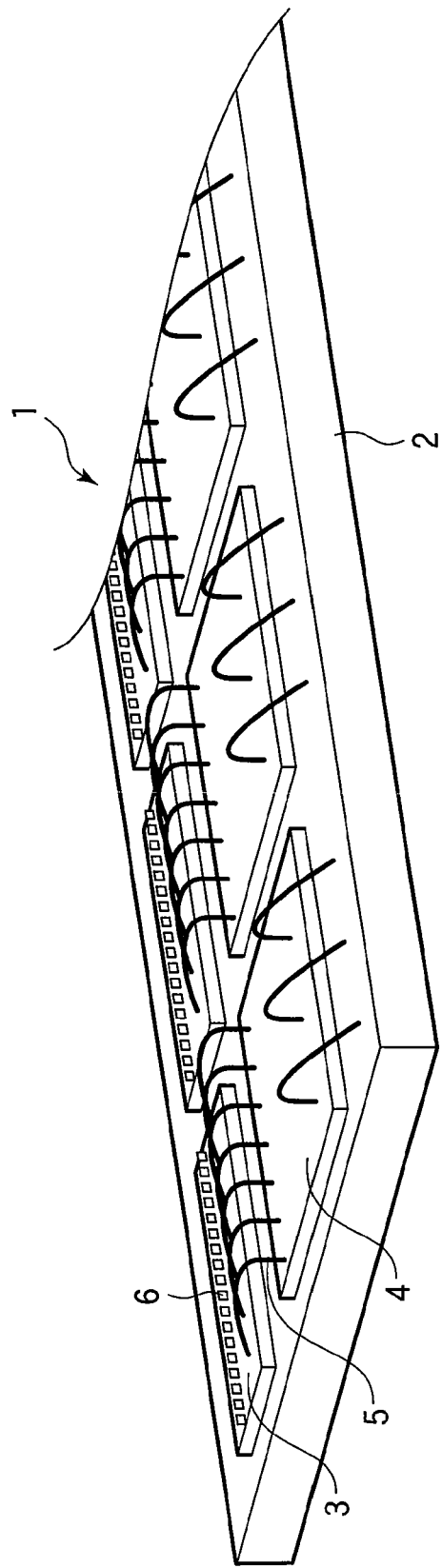
FIG. 34 is a perspective view of a conventional LED unit.
Figure 35:
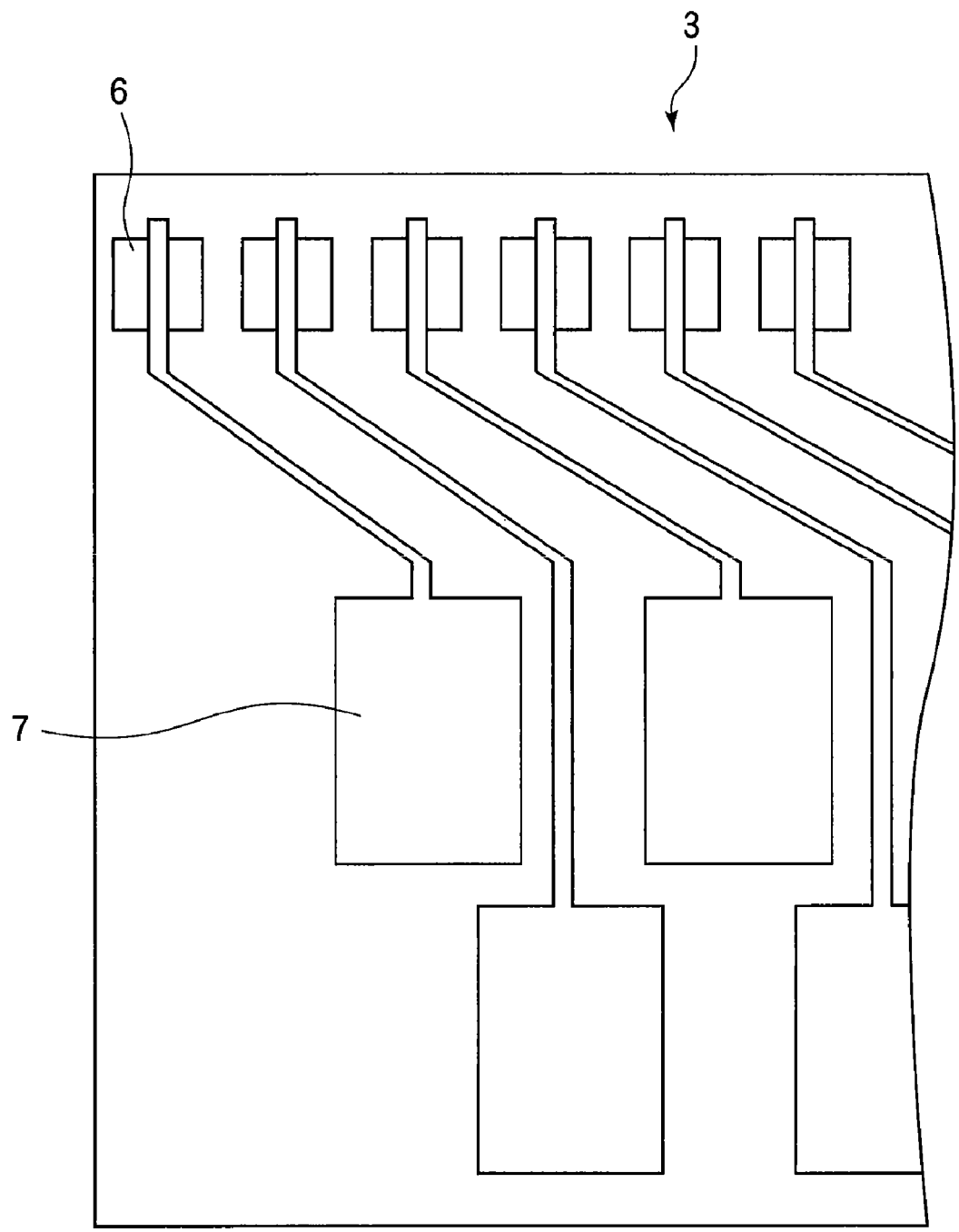
FIG. 35 is a plan view of the conventional LED unit of FIG. 34.

FIG. 33 shows the image forming apparatus according to the fifteenth embodiment. As shown in FIG. 33, the image forming apparatus includes a sheet cassette 2001 in which the recording media P (on which an image has not been printed) are stacked. A hopping roller 2002 is provided in contact with the surface of the uppermost recording medium P. When the hopping roller 2002 rotates, the recording medium P is fed out of the sheet cassette 2001 one by one, and is fed to a sheet feeding path. The recording medium P is fed by the rotation of a pair of rollers (a pinch roller 2003 and a resist roller 2004) and another pair of rollers (a pinch roller 2005 and a resist roller 2006) disposed on the downstream side of the hopping roller 2002 along the sheet feeding path. The recording medium P is sandwiched by the pinch roller 2003 and the resist roller 2004, and then sandwiched by the pinch roller 2005 and the resist roller 2006 so that the skew of the recording medium P is corrected, and then the recording medium P is fed to process units 2007Y, 2007M, 2007C and 2007B.

The process units 2007Y, 2007M, 2007C and 2007B are disposed on the downstream side of the pinch roller 2005 and the resist roller 2006. The process units 2007Y, 2007M, 2007C and 2007B form images of four colors of Yellow (Y), Magenta (M), Cyan (C) and Black (C) and are arranged along the sheet feeding path from the upstream side to the downstream side in this order. The process units 2007Y, 2007M, 2007C and 2007B have the same configurations, and therefore the process units 2007Y, 2007M, 2007C and 2007B are collectively referred to as a process unit 2007 that will be described hereinafter.

The process unit 2007 has a photosensitive drum 2007a (i.e., an image bearing body) rotated by a not shown driving source or gears in the direction in which the recording medium P is fed. Along the circumference of the photosensitive drum 2007a, a charging device 2007b that uniformly charges the surface of the photosensitive drum 2007a, and an exposing device 2007c that irradiates the surface of the photosensitive drum 2007a (charged by the charging device 2007b) with light to form a latent image thereon are arranged in this order from the upstream to the downstream in the rotating direction of the photosensitive drum 2007a. The print heads described in the twelfth to fourteenth embodiments can be used as the exposing device 2007c. The process unit 2007 further includes a developing device 2007d that supplies the toner to the surface of the photosensitive drum 2007a on which the latent image is formed to form a toner image, and a cleaning device 2007e that removes the residual toner that remains on the surface of the photosensitive drum 2007a.

The image forming apparatus further includes transfer rollers 2008 in opposition to the respective photosensitive drums 2007a of the process units 2007. The transfer rollers 2008 are made of semiconductor rubber or the like. In the image forming apparatus, a difference in electric potential is generated between the surface of each photosensitive drum 2007a and the corresponding transfer roller 2008, in order to cause the toner on the photosensitive drum 2007a to adheres to the recording medium P.

The image forming apparatus further includes a fixing device 2009 on the downstream side of the process units 2007Y, 2007M, 2007C, 2007B. The fixing device 2009 includes a heat roller that rotates in the direction in which the recording medium P is fed and a backup roller that rotates in contact with the surface of the heating roller. The fixing device 2009 is configured to nip the recording medium p between the heat roller and the backup roller to heat and press the recording medium P, so as to fix the toner image (having been transferred to the recording medium P) to the recording medium P.

The above configured image forming apparatus feds the recording medium P at a predetermined feeding speed to the process unit 2007, and the process unit 2007 forms the image on the recording medium P. To be more specific, when the recording medium P is fed, and when image signal is inputted to the process unit 2007, the image forming apparatus causes the light-emitting elements (not shown) of the exposing device 2007c to irradiate the surface of the photosensitive drum 2007a (charged by the charging device 2007b) with light, to thereby form the latent image on the surface of the photosensitive drum 2007a. Then, the image forming apparatus causes the toner stored in the process unit 2007 to adhere to the latent image, and then transfers the toner image to the recording medium P by means of the transfer roller 2008.

The image forming apparatus causes the recording medium P to pass the process units 2007Y, 2007M, 2007C and 2007B in this order, and respectively performs the above described operations, with the result that the toner images of the respective colors are transferred to the recording medium P.

Further, when the recording medium P to which the unfixed toner has been transferred is fed to the fixing device 2009, the image forming apparatus causes the fixing device 2009 to fix the toner image to the recording medium P. Then, the image forming apparatus causes a pinch roller 2010, an eject roller 2011, a pinch roller 2012 and an eject roller 2013 (disposed on the downstream side of the fixing device 2009) to rotate, so as to feed the recording medium P to a recording media stacker portion 2014.

Thus, the image forming apparatus forms color image on the recording medium P.

As described above, the image forming apparatus according to the fifteenth embodiment uses the print head according to the twelfth to fourteenth embodiments as the exposing device 2007c. Therefore, it becomes possible to enhance a space efficiency, to enhanced the image quality, and to reduce manufacturing cost.

The present invention is not limited to the above described embodiments. For example, in the above described embodiments, the composite semiconductor device is described to be applicable to the print head. However, the present invention is not limited to the light-emitting element such as light-emitting thyristor, but is applicable to any element that controls an arbitrary active element. Furthermore, the present invention is applicable to an arbitrary light-emitting element such as a semiconductor laser or the like.

Moreover, in the present invention, the above described conductivity type of the semiconductor thin-film can be modified. To be more specific, n-type can be changed to p-type, and p-type can be changed to n-type. Further, the conductivity type of the active layer can be appropriately modified to various types such as n-type, p-type, non-doped or the like.

Furthermore, in the above described embodiments, the first semiconductor material group of the semiconductor thin-film is described to be GaAs, AlGaAs, AlGaAsP. However, in the present invention, the semiconductor thin-film can include one of or any combination of nitride based semiconductor materials such as GaN, AlGaN, InGaN, InAlN, InN, AlN or the like.

Additionally, in the above described embodiments, the junction structure of the light-emitting element is described to be double-hetero junction structure. However, the present invention is not limited to the double-hetero junction structure, but single-hetero junction or homogeneous junction can be employed.

In addition, in the above described embodiments, the semiconductor thin-film of the composite semiconductor device is described to be light-emitting epitaxial film. However, the present invention is applicable to an arbitrary light-emitting element, and it is also possible to use a light-receiving element instead of the light-emitting element. Other variations can be employed.

Further, the configurations of the printer head and the image forming apparatus are not limited to those shown in FIGS. 30 to 38, but an arbitrary configuration can be employed.

In the above described embodiments, the semiconductor device (i.e., the semiconductor thin-film) has three terminals (i.e., the first, second and third contact layers) and forms the thyristor structure or transistor structure. Therefore, it becomes possible to simplify the structure of the control circuit element connected to the semiconductor device. Further, since the semiconductor device is composed of the semiconductor thin-film, and since the semiconductor device and the external device can be connected to each other via the thin-film wirings, the wire-bonding becomes unnecessary. Thus, it becomes possible to reduce the regions for the connection pads of the wire-bonding. As a result, the cost of the semiconductor device and the control circuit element can be reduced.

Moreover, the semiconductor device having three-terminal structure enables to simplify the structure of the control circuit element connected to the semiconductor device. Furthermore, the control circuit (for controlling the light-emission of the light-emitting region of the composite semiconductor device) can be provided outside the composite semiconductor device. As a result, the cost of the composite semiconductor device can be reduced.

While the preferred embodiments of the present invention have been illustrated in detail, it should be apparent that modifications and improvements may be made to the invention without departing from the spirit and scope of the invention as described in the following claims.

What is claimed is:

1. A semiconductor device having a layered structure of semiconductor layers, said semiconductor device comprising:
    a light-emitting layer of a first conductivity type, a second conductivity type or a non-doped type;
    a first contact layer of said second conductivity type disposed above said light-emitting layer, said first contact layer directly contacting and being connected to an anode electrode of a thyristor structure and being supplied with a voltage;
    a second contact layer of said second conductivity type disposed below said light-emitting layer, said second contact layer directly contacting and being connected to a gate electrode of said thyristor structure and being supplied with a voltage;
    a first etching stopper layer of said first or second conductivity type disposed below said light-emitting layer and above said second contact layer, said first etching stopper layer being composed of a material different from said second contact layer and allowing selective etching for said second contact layer, and
    a third contact layer of said first conductivity type disposed below said second contact layer, said third contact layer directly contacting and being connected to a cathode electrode of said thyristor structure and being supplied with a voltage.

2. The semiconductor device according to claim 1, further comprising a second etching stopper layer of said first conductivity type disposed below said second contact layer and above said third contact layer, said second etching stopper layer allowing selective etching for said third contact layer.

3. The semiconductor device according to claim 1, further comprising a first semiconductor layer of said first conductivity type disposed below said light-emitting layer and above said first etching stopper layer, said first semiconductor layer having a larger energy band gap than said light-emitting layer.

4. The semiconductor device according to claim 1, further comprising a second semiconductor layer of said second conductivity type disposed above said light-emitting layer and below said first contact layer, said second semiconductor layer having a larger energy band gap than said light-emitting layer.

5. The semiconductor device according to claim 2, further comprising a third semiconductor layer disposed below said second contact layer and above said second etching stopper layer, said third semiconductor layer having a larger energy band gap than said light-emitting layer.

6. The semiconductor device according to claim 1, further comprising a fourth semiconductor layer of said first conductivity type disposed below said third contact layer, said fourth semiconductor layer having a larger energy band gap than said light-emitting layer.

7. The semiconductor device according to claim 1, wherein said semiconductor layers of said layered structure are formed of compound semiconductor layers.

8. A composite semiconductor device comprising a first substrate having a predetermined integrated circuits, and a semiconductor device having a light-emitting element electrically connected to said integrated circuits,
    said light-emitting element comprising:
    a light-emitting layer of a first conductivity type, a second conductivity type or a non-doped type,
    a first contact layer of said second conductivity type disposed above said light-emitting layer, said first contact layer directly contacting and being connected to an anode electrode of a thyristor structure and being supplied with a voltage;
    a second contact layer of said second conductivity type disposed below said light-emitting layer, said second contact layer directly contacting and being connected to a gate electrode of said thyristor structure and being supplied with a voltage;
    a first etching stopper layer of said first or second conductivity type disposed below said light-emitting layer and above said second contact layer, said first etching stopper layer being composed of a material different from said second contact layer and allowing selective etching for said second contact layer, and a third contact layer of said first conductivity type disposed below said second contact layer, said third contact layer directly contacting and being connected to a cathode electrode of said thyristor structure and being supplied with a voltage.

9. The composite semiconductor device according to claim 8, wherein said semiconductor device is a thin-film semiconductor.

10. The composite semiconductor device according to claim 8, wherein said semiconductor device is a thin-film semiconductor formed by epitaxial growth on a substrate different from said first substrate, and separated or peeled off from said substrate.

11. The composite semiconductor device according to claim 8, further comprising a second etching stopper layer of said first conductivity type disposed below said second contact layer and above said third contact layer, said second etching stopper layer allowing selective etching for said third contact layer.

12. The composite semiconductor device according to claim 8, further comprising a first semiconductor layer of said first conductivity type disposed below said light-emitting layer and above said first etching stopper layer, said first semiconductor layer having a larger energy band gap than said light-emitting layer.

13. The composite semiconductor device according to claim 8, further comprising a second semiconductor layer of said second conductivity type disposed above said light-emitting layer and below said first contact layer, said second semiconductor layer having a larger energy band gap than said light-emitting layer.

14. The composite semiconductor device according to claim 8, further comprising a third semiconductor layer disposed below said second contact layer and above said second etching stopper layer, said third semiconductor layer having a larger energy band gap than said light-emitting layer.

15. The composite semiconductor device according to claim 8, further comprising a fourth semiconductor layer of said first conductivity type disposed below said third contact layer, said fourth semiconductor layer having a larger energy band gap than said light-emitting layer.

16. The composite semiconductor device according to claim 8, wherein semiconductor layers of said semiconductor device are formed of compound semiconductor layers.

17. The composite semiconductor device according to claim 8, wherein said first substrate is a single-crystal Si substrate, to which said semiconductor device adheres.

18. The composite semiconductor device according to claim 8, wherein said first substrate and said first semiconductor device are disposed on insulation materials.

19. The composite semiconductor device according to claim 17, wherein said first substrate is composed of one of polysilicon, amorphous silicon, or organic semiconductor.

20. The semiconductor device according to claim 1, further comprising a substrate on which said layered structure is formed, wherein said anode electrode, said gate electrode, and said cathode electrode are disposed on the same side with respect to the substrate, and wherein said anode electrode is disposed between said gate electrode and said cathode electrode in a direction parallel to a surface of the substrate.

* * * * *